(12) United States Patent
Seol et al.

(10) Patent No.: US 9,269,721 B2
(45) Date of Patent: Feb. 23, 2016

(54) MEMORY DEVICE

(71) Applicants: Kwang Soo Seol, Yongin-si (KR); JinTae Kang, Osan-si (KR); Seong Soon Cho, Suwon-si (KR)

(72) Inventors: Kwang Soo Seol, Yongin-si (KR); JinTae Kang, Osan-si (KR); Seong Soon Cho, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/807,879

(22) Filed: Jul. 23, 2015

(65) Prior Publication Data

US 2015/0325586 A1 Nov. 12, 2015

Related U.S. Application Data

(60) Division of application No. 14/530,638, filed on Oct. 31, 2014, now Pat. No. 9,129,861, and a continuation-in-part of application No. 13/844,337, filed on Mar. 15, 2013.

(30) Foreign Application Priority Data

Oct. 5, 2012 (KR) .......................... 10-2012-0110751
Nov. 19, 2013 (KR) .......................... 10-2013-0140672

(51) Int. Cl.
*G11C 11/34* (2006.01)
*G11C 16/04* (2006.01)
*H01L 27/115* (2006.01)

(52) U.S. Cl.
CPC .... *H01L 27/11573* (2013.01); *H01L 27/11565* (2013.01); *H01L 27/11582* (2013.01)

(58) Field of Classification Search
USPC .............. 365/185.29, 185.23, 185.18, 185.14
See application file for complete search history.

(56) References Cited

U.S. PATENT DOCUMENTS 7,902,023 B2   3/2011   Izumi et al.
7,910,973 B2   3/2011   Sakaguchi et al.

(Continued)

FOREIGN PATENT DOCUMENTS

| KR | 100528070 B1 | 11/2005 |
| KR | 20100091900 A | 8/2010 |
| KR | 101055587 B1 | 8/2011 |

OTHER PUBLICATIONS

Final Office Action for U.S. Appl. No. 13/844,337, mailed Jan. 27, 2015.

(Continued)

*Primary Examiner* — Telly Green
(74) *Attorney, Agent, or Firm* — Renaissance IP Law Group LLP

(57) ABSTRACT

Provided is a memory device including first to third selection lines extending in a first direction and sequentially arranged in a second direction crossing the first direction, multiple sets of first to third vertical pillars, each set coupled with a corresponding one of the first to third selection lines and sequentially arranged in the second direction, a first sub-interconnection connecting the third vertical pillar coupled with the first selection line to the first vertical pillar coupled with the second selection line, a second sub-interconnection connecting the third vertical pillar coupled with the second selection line to the first vertical pillar coupled with the third selection line, and bit lines extending in the second direction and connected to corresponding ones of the first and second sub-interconnections.

14 Claims, 36 Drawing Sheets

(56) References Cited

U.S. PATENT DOCUMENTS

| | | |
|---|---|---|
| 7,928,580 B2 | 4/2011 | Saito |
| 8,008,710 B2 | 8/2011 | Fukuzumi et al. |
| 8,068,364 B2 | 11/2011 | Maejima |
| 8,072,025 B2 | 12/2011 | Nishihara et al. |
| 8,084,805 B2 | 12/2011 | Shim et al. |
| 8,084,809 B2 | 12/2011 | Maeda et al. |
| 8,193,571 B2 | 6/2012 | Katsumata et al. |
| 8,278,699 B2 | 10/2012 | Tanaka et al. |
| 8,450,788 B2 | 5/2013 | Shim et al. |
| 8,541,832 B2 | 9/2013 | Kim et al. |
| 8,644,046 B2 | 2/2014 | Seol et al. |
| 8,792,282 B2 | 7/2014 | Lee et al. |
| 2005/0006710 A1 | 1/2005 | Riedel |
| 2007/0181933 A1 | 8/2007 | Servalli et al. |
| 2007/0278559 A1 | 12/2007 | Saito |
| 2008/0074927 A1 | 3/2008 | Hofmann et al. |
| 2009/0090959 A1 | 4/2009 | Nishihara et al. |
| 2009/0121271 A1 | 5/2009 | Son et al. |
| 2009/0230449 A1 | 9/2009 | Sakaguchi et al. |
| 2009/0242968 A1 | 10/2009 | Maeda et al. |
| 2009/0296446 A1 | 12/2009 | Asao |
| 2010/0038699 A1 | 2/2010 | Katsumata et al. |
| 2010/0038703 A1 | 2/2010 | Fukuzumi et al. |
| 2010/0078701 A1 | 4/2010 | Shim et al. |
| 2010/0090286 A1 | 4/2010 | Lee et al. |
| 2010/0202206 A1 | 8/2010 | Seol et al. |
| 2010/0207194 A1 | 8/2010 | Tanaka et al. |
| 2010/0224929 A1 | 9/2010 | Jeong et al. |
| 2010/0309351 A1 | 12/2010 | Smith et al. |
| 2010/0311210 A1 | 12/2010 | Izumi et al. |
| 2011/0018051 A1 | 1/2011 | Kim et al. |
| 2011/0044093 A1 | 2/2011 | Koh et al. |
| 2011/0063910 A1 | 3/2011 | Maejima |
| 2011/0156132 A1 | 6/2011 | Kiyotoshi |
| 2011/0199804 A1 | 8/2011 | Son et al. |
| 2011/0316069 A1 | 12/2011 | Tanaka et al. |
| 2012/0057405 A1 | 3/2012 | Ogiwara et al. |
| 2012/0061741 A1 | 3/2012 | Shim et al. |
| 2012/0112264 A1 | 5/2012 | Lee et al. |
| 2012/0153291 A1 | 6/2012 | Kim et al. |
| 2012/0275234 A1 | 11/2012 | Lee et al. |
| 2013/0003433 A1 | 1/2013 | Hishida et al. |
| 2013/0009274 A1 | 1/2013 | Lee et al. |
| 2013/0092994 A1 | 4/2013 | Shim et al. |
| 2013/0234338 A1 | 9/2013 | Uenaka et al. |
| 2013/0256775 A1 | 10/2013 | Shim et al. |

OTHER PUBLICATIONS

Notice of Allowance for U.S. Appl. No. 14/530,638, mailed May 27, 2015.
Office Action for U.S. Appl. No. 13/844,337, mailed Aug. 18, 2014.
Office Action for U.S. Appl. No. 13/844,337, mailed Jun. 11, 2015.
Office Action for U.S. Appl. No. 13/844,337, mailed May 13, 2014.
Office Action for U.S. Appl. No. 14/200,002, mailed Aug. 19, 2014.
Office Action for U.S. Appl. No. 14/200,002, mailed Jan. 27, 2015.
Final Office Action for U.S. Appl. No. 14/200,002, mailed Aug. 24, 2015.
Notice of Allowance for U.S. Appl. No. 13/844,337, mailed Sep. 21, 2015.
Notice of Allowance for U.S. Appl. No. 14/200,002, mailed Nov. 9, 2015.

MEMORY DEVICE

CROSS-REFERENCE TO RELATED APPLICATIONS

This U.S. non-provisional patent application is a divisional of U.S. patent application Ser. No. 14/530,638, filed Oct. 31, 2014, which is a continuation-in-part of U.S. patent application Ser. No. 13/844,337, filed Mar. 15, 2013 which claims the benefit of Korean Patent Application No. 10-2012-0110751, filed Oct. 5, 2012, and which claims priority under 35 U.S.C. §119 to Korean Patent Application No. 10-2013-0140672, filed on Nov. 19, 2013, in the Korean Intellectual Property Office, the disclosure of which is hereby incorporated herein in its by reference.

BACKGROUND

The present disclosure herein relates to a semiconductor device, and in particular, to a vertical-type memory device.

Higher integration of semiconductor devices is desired to satisfy demands for high-performance and low-cost electronic devices. In particular, the integration of memory devices can affect product prices. The integration density of typical two-dimensional (2D) or planar memory devices may be determined by the area occupied by a unit memory cell. Thus, integration of the 2D or planar memory devices may be influenced by fine pattern technology used in the device. However, process equipment for increasing pattern fineness may be very expensive and therefore can set a practical limit on increasing integration density for 2D or planar memory devices.

SUMMARY

Example embodiments of the inventive concept may provide a vertical-type memory device with increased integration density and improved performance.

According to example embodiments of the inventive concept, a memory device may include first to third selection lines extending in a first direction and sequentially arranged in a second direction crossing the first direction, multiple sets of first to third vertical pillars, each set coupled with a corresponding one of the first to third selection lines and sequentially arranged in the second direction, a first sub-interconnection connecting the third vertical pillar coupled with the first selection line to the first vertical pillar coupled with the second selection line, a second sub-interconnection connecting the third vertical pillar coupled with the second selection line to the first vertical pillar coupled with the third selection line, and bit lines extending in the second direction and connected to corresponding ones of the first and second sub-interconnections.

In example embodiments, the bit lines may include first to third bit lines sequentially arranged in the first direction. The first bit line may be connected to the first sub-interconnection. The second bit line may be connected to the second vertical pillar. The third bit line may be connected to the second sub-interconnection.

In example embodiments, the memory device may further include a third sub-interconnection connected to the second vertical pillar coupled to each of the first to third selection lines, and the second bit line may be connected to the second vertical pillar via the third sub-interconnection.

In example embodiments, the first and second sub-interconnections may be connected to the first and third vertical pillars via first and third lower contacts, the first and third bit lines may be connected to the first and second sub-interconnections, respectively, via first and third upper contacts, and the second bit line may be connected to the second vertical pillar via a second lower contact and a second upper contact that are in contact with each other.

In example embodiments, the memory device may further include a substrate on which the first to third selection lines are provided, and at least one cell gate provided between the substrate and each of the first to third selection lines. The vertical pillars may be connected to the substrate. Each vertical pillar passes through a corresponding one of the first to third selection lines and a corresponding cell gate.

In example embodiments, the memory device may further include a charge storing element provided between the cell gate and a corresponding one of the vertical pillars.

According to example embodiments of the inventive concept, a memory device may include a plurality of selection lines extending in a first direction and spaced apart from each other in a second direction crossing the first direction, a plurality of vertical pillars, each coupled to a corresponding one of the selection lines, a sub-interconnection extending on adjacent ones of the selection lines, and a bit line connected to the sub-interconnection and extending in the second direction. Here, the selection lines may include first to third selection lines sequentially disposed adjacent to each other in the second direction. The vertical pillars may be disposed to form a zigzag arrangement and include first to fifth vertical pillars constituting first to fifth columns, respectively, which are sequentially arranged in the second direction.

In example embodiments, the second vertical pillar may be shifted from the first vertical pillar by a first distance in the first direction, the third vertical pillar may be shifted from the second vertical pillar by the first distance in the first direction, the fourth vertical pillar may be shifted from the third vertical pillar by the first distance in the first direction, and the fifth vertical pillar may be shifted from the fourth vertical pillar by the first distance in the first direction.

In example embodiments, the first vertical pillar coupled with the second selection line may be shifted from the first vertical pillar coupled with the first selection line by the first distance in the first direction.

In example embodiments, the sub-interconnection may include a first sub-interconnection connecting the fourth vertical pillar of the first selection line to the first vertical pillar of the second selection line, a second sub-interconnection connecting the fifth vertical pillar of the second selection line to the second vertical pillar of the third selection line, a third sub-interconnection connecting the fifth vertical pillar of the first selection line to the second vertical pillar of the second selection line, and a fourth sub-interconnection connecting the fourth vertical pillar of the second selection line to the first vertical pillar of the third selection line.

In example embodiments, the memory device may further include a fifth sub-interconnection connected to the third vertical pillar coupled with each of the selection lines.

In example embodiments, the bit line may include first to fifth bit lines sequentially arranged adjacent to each other in the first direction, and each of the first to fifth sub-interconnections may be connected to a respective different one of the bit lines.

In example embodiments, the sub-interconnections may be connected to the vertical pillars, respectively, via lower contacts provided on the vertical pillars, and the bit lines may be connected to the sub-interconnections, respectively, via upper contacts provided on the sub-interconnections.

In example embodiments, the bit line may include first to fifth bit lines sequentially arranged adjacent to each other in the first direction, the first to fourth sub-interconnections may be connected to the first, second, fourth and fifth vertical pillars via first lower contacts, each of which is provided on a corresponding one of the first, second, fourth and fifth vertical pillars, four of the bit lines may be connected to the first to fourth sub-interconnections, respectively, via first upper contacts, each of which is provided on a corresponding one of the first to fourth sub-interconnections, and the remaining one of the bit lines may be connected to the third vertical pillar via a second lower contact and a second upper contact, which are provided on the third vertical pillar coupled with each of the selection lines to be in contact with each other.

In example embodiments, the vertical pillars coupled to each of the selection lines further include sixth vertical pillars constituting a sixth column arranged next to the fifth column, and each of the sixth vertical pillar may be shifted from a corresponding one of the fifth vertical pillars by the first distance in the first direction.

In example embodiments, the sub-interconnection may include a first sub-interconnection connecting the fifth vertical pillar of the first selection line to the first vertical pillar of the second selection line, a second sub-interconnection connecting the fifth vertical pillar of the second selection line to the first vertical pillar of the third selection line, a third sub-interconnection connecting the sixth vertical pillar of the first selection line to the second vertical pillar of the second selection line, and a fourth sub-interconnection connecting the sixth vertical pillar of the second selection line to the second vertical pillar of the third selection line.

In example embodiments, the memory device may further include a fifth sub-interconnection connected to the third vertical pillar coupled with each of the selection lines, and a sixth sub-interconnection connected to the fourth vertical pillar coupled with each of the selection lines.

In example embodiments, the bit line may include first to sixth bit lines sequentially arranged adjacent to each other in the first direction, and each of the first to sixth sub-interconnections may be connected to a respective different one of the bit lines.

In example embodiments, the sub-interconnections may be connected to the vertical pillars, respectively, via lower contacts provided on the vertical pillars, and the bit lines may be connected to the sub-interconnections, respectively, via upper contacts provided on the sub-interconnections.

In example embodiments, the bit line may include first to sixth bit lines sequentially arranged adjacent to each other in the first direction, the first to fourth sub-interconnections may be connected to the first, second, fifth, and sixth vertical pillars, respectively, via first lower contacts provided on the first, second, fifth and sixth vertical pillars, the first, fourth, sixth, and third bit lines may be connected to the first to fourth sub-interconnections, respectively, via first upper contacts provided on the first to fourth sub-interconnections, the second bit line may be connected to the third vertical pillar via a second lower contact and a second upper contact, which are sequentially stacked on the third vertical pillar coupled with each of the selection lines to be in contact with each other, and the fifth bit line may be connected to the fourth vertical pillar via a third lower contact and a third upper contact, which are provided on the fourth vertical pillar coupled with each of the selection lines.

According to example embodiments of the inventive concept, a memory device may include a plurality of selection lines extending in a first direction and spaced apart from each other in a second direction crossing the first direction, a plurality of vertical pillars each coupled to a corresponding one of the selection lines, a sub-interconnection extending over adjacent ones of the selection lines, and a bit line connected to the sub-interconnection and extending in the second direction. Here, the selection lines may include first to third selection lines, which are sequentially disposed adjacent to each other in the second direction. The vertical pillars may be disposed to form a matrix-shaped arrangement and include first to third vertical pillars constituting first to third columns, respectively, which are sequentially arranged in the second direction.

In example embodiments, the sub-interconnection may include a first sub-interconnection connecting the third vertical pillar coupled with the first selection line to the first vertical pillar coupled with the second selection line, and a second sub-interconnection connecting the third vertical pillar coupled with the second selection line to the first vertical pillar coupled with the third selection line.

In example embodiments, the memory device may further include third sub-interconnections connected to the second vertical pillar.

In example embodiments, the bit line may include first to third bit lines sequentially arranged adjacent to each other in the first direction, and each of the first to third sub-interconnections may be connected to a respective different one of the bit lines.

In example embodiments, the sub-interconnections may be connected to the vertical pillars, respectively, via lower contacts provided on the vertical pillars, and the bit lines may be connected to the sub-interconnections, respectively, via upper contacts provided on the sub-interconnections.

In example embodiments, the bit line may include first to third bit lines sequentially arranged adjacent to each other in the first direction, the first and second sub-interconnections may be connected to the first and third vertical pillars, respectively, via first lower contacts provided on the first and third vertical pillars, two of the bit lines may be connected to the first and second sub-interconnections, respectively, via first upper contacts provided on the first and second sub-interconnections, the remaining one of the bit lines may be connected to the second vertical pillar via a second lower contact and a second upper contact, which are sequentially stacked on the second vertical pillar coupled with each of the selection lines to be in contact with each other.

According to example embodiments of the inventive concept, a memory device may include first and second vertical pillars coupled with a selection line extending in a first direction and sequentially arranged in a second direction crossing the first direction, a first sub-interconnection connected to the first vertical pillar via a first lower contact on the first vertical pillar, a second sub-interconnection connected to the second vertical pillar via a second lower contact on the second vertical pillar, a first bit line connected to the first sub-interconnection via a first upper contact and extending in the second direction, the first upper contact being offset from the first vertical pillar in the first direction, and a second bit line connected to the second sub-interconnection via a second upper contact and extending in the second direction, the second upper contact being offset from the second vertical pillar in the direction opposite to the first direction.

In example embodiments, the memory device may further include a third vertical pillar arranged between the first and second vertical pillars, and a third bit line provided between the first bit line and the second bit line and connected to the third vertical pillar via a third lower contact and a third upper contact, which are overlapped with the third vertical pillar.

In some embodiments, a memory device, comprising: first and second selection lines extending in a first direction and sequentially arranged in a second direction crossing the first direction; vertical pillars, each coupled with a corresponding one of the first and second selection lines; a sub-interconnection connecting one of the vertical pillars coupled with the first selection line to one of the vertical pillars coupled with the second selection line; and a bit line extending in the second direction and connected to the sub-interconnection. At least one of the vertical pillars coupled with one of the first and second selection lines may not be connected with any vertical pillar coupled with the other of the first and second selection lines.

In some other embodiments, a memory device, comprising: first to third selection lines extending in a first direction and sequentially arranged in a second direction crossing the first direction; multiple sets of first to third vertical pillars, each set coupled with a corresponding one of the first to third selection lines; a first sub-interconnection connecting one of the vertical pillars coupled with the first selection line to one of the vertical pillars coupled with the second selection line; a second sub-interconnection connecting another of the vertical pillars coupled with the second selection line to one of the vertical pillars coupled with the third selection line; and bit lines extending in the second direction and connected to corresponding ones of the first and second sub-interconnections. At least one of the vertical pillars coupled with at least one of the selection lines may be arranged independently from vertical pillars coupled to other selection lines. In some embodiments, the independently arranged vertical pillar may not be connected to any other vertical pillars in any other selection lines through a sub-interconnection.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 6A through 11A are plan views illustrating a process of fabricating the vertical-type memory device, according to an example of a first embodiment of the inventive concept, and FIGS. 6B through 11B are sectional views taken along line I-I' of FIGS. 6A through 11A, respectively.

Figure 1:
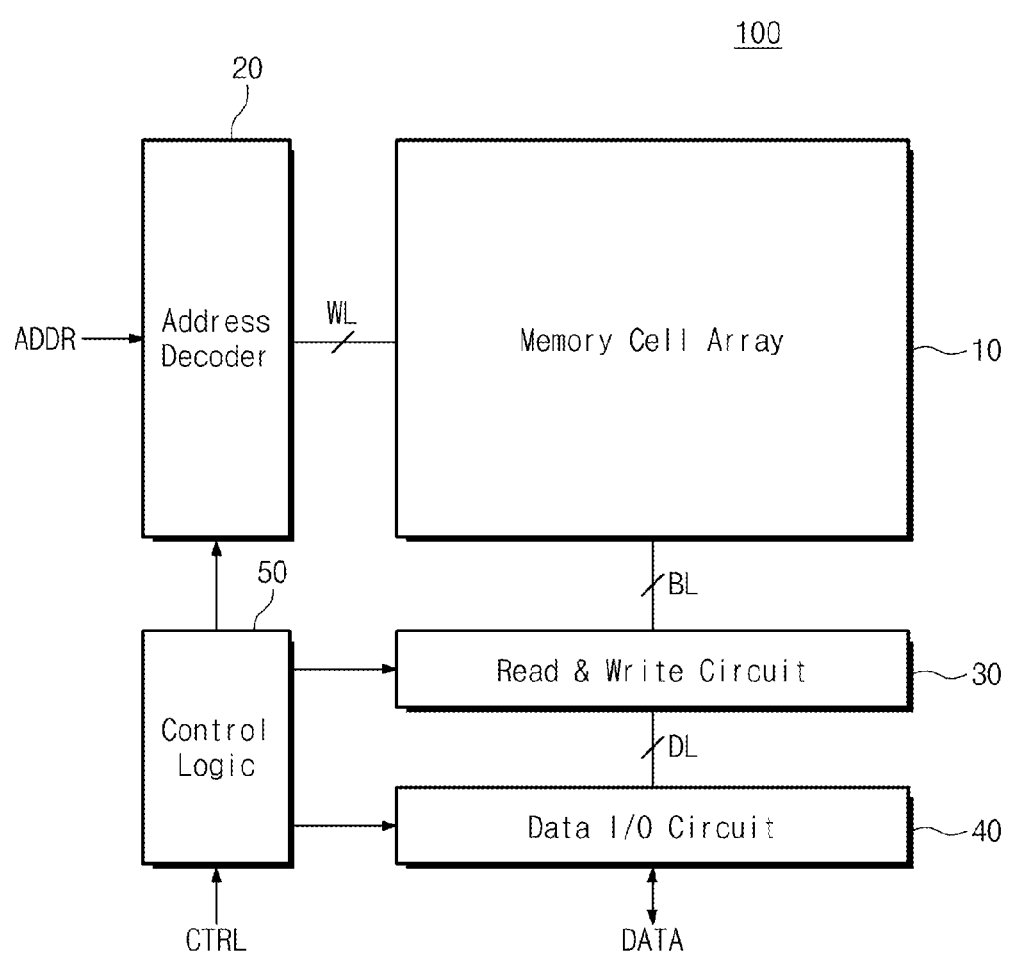
FIG. 1 is a block diagram illustrating a memory device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

FIG. 1 is a block diagram illustrating a memory device according to example embodiments of the inventive concept. Referring to FIG. 1, a memory device 100 according to some embodiments of the inventive concept may include a memory cell array 10, an address decoder 20, a read/write circuit 30, a data input/output circuit 40, and a control logic 50.

The memory cell array 10 may be connected to the address decoder 20 via a plurality of word lines WL, and be connected to the read/write circuit 30 via a plurality of bit lines BL. The memory cell array 10 includes a plurality of memory cells. For example, the memory cell array 10 may store one or more bits in each cell.

The address decoder 20 may be connected to the memory cell array 10 via the word lines WL. The address decoder 20 operates in response to the control of the control logic 50. The address decoder 20 may receive an address ADDR from the outside. The address decoder 20 decodes a row address among the received address ADDR to select a corresponding word line from among the word lines WL. Also, the address decoder 20 decodes a column address among the address ADDR and transfers the decoded column address to the read/write circuit 30. For example, the address decoder 20 may include elements such as a row decoder, a column decoder, address buffer, or the like.

The read/write circuit 30 may be connected to the memory cell array 10 via the bit lines BL, and be connected to the data input/output circuit 40 via the data lines DL. The read/write circuit 30 may be configured to operate in response to the control of the control logic 50. The read/write circuit 30 may be configured to receive the decoded column address from the address decoder 20. The read/write circuit 30 may be configured to select a bit line BL using the decoded column address. For example, the read/write circuit 30 may be configured to receive data from the data input/output circuit 40 and write the received data in the memory cell array 10. The read/write circuit 30 may be configured to read data from the memory cell array 10 and transfers the read data to the data input/output circuit 40. The read/write circuit 30 may be configured to read data from a first storage region of the memory cell array 10, and write the read data in a second storage region of the memory cell array 10. For example, the read/write circuit 30 may be configured to perform a copy-back operation.

The read/write circuit 30 may include elements which include a page buffer (or a page register), a column selection circuit, or the like. As another example, the read/write circuit 30 may include elements which include a sensing amplifier, a write driver, a column selection circuit, or the like.

The data input/output circuit 40 may be connected to the read/write circuit 30 via the data lines DL. The data input/output circuit 40 may be configured to operate in response to the control of the control logic 50. The data input/output circuit 40 exchanges data DATA with the external devices. The data input/output circuit 40 may be configured to transfer the data DATA to the read/write circuit 30 via the data lines DL. The data input/output circuit 40 outputs the data DATA, which is transmitted from the read/write circuit 30 through the data lines DL, to the external devices. For example, the data input/output circuit 40 may include an element such as a data buffer.

The control logic 50 may be connected to the address decoder 20, the read/write circuit 30 and the data input/output circuit 40. The control logic 50 may be configured to control the operation of the memory device 100. The control logic 50 may operate in response to a control signal CTRL transmitted from the outside.

Figure 2:
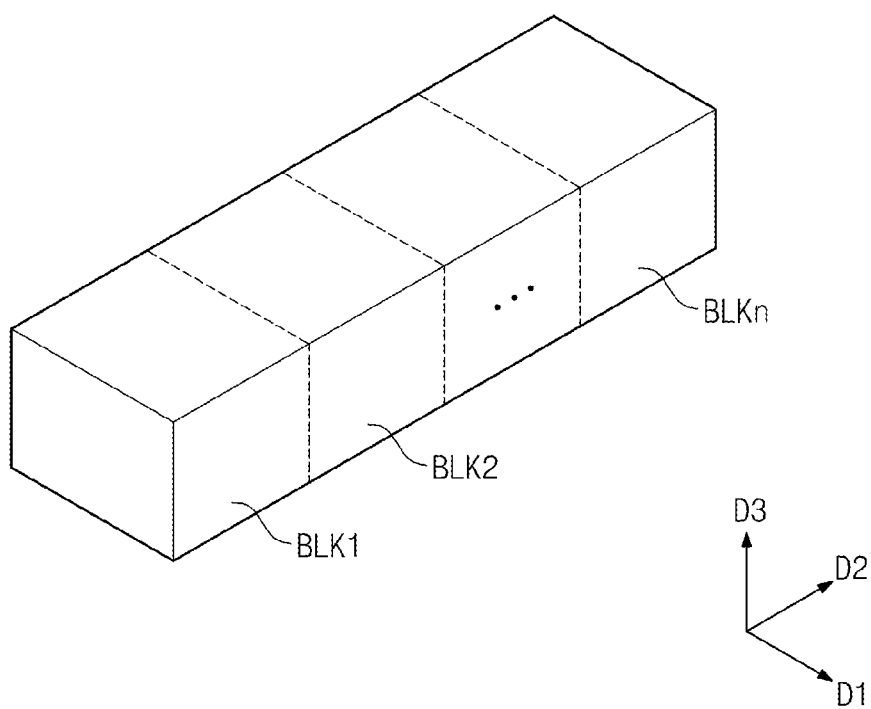
FIG. 2 is a block diagram illustrating an example of the memory cell array of FIG. 1.

FIG. 2 is a block diagram illustrating an example of the memory cell array 10 of FIG. 1. Referring to FIG. 2, the memory cell array 10 may include a plurality of memory blocks BLK1 to BLKn. Each of the memory blocks BLK1 to BLKn may have a three-dimensional (3D) structure (or a vertical structure) as opposed to a planar structure. For example, each of the memory blocks BLK1 to BLKn may include structures extending in first, second and third directions along corresponding orthogonal axes. For example, each of the memory blocks BLK1 to BLKn includes a plurality of cell strings that are extended in the third direction and the memory blocks BLK1~BLKn extend in the second direction. Additional memory blocks may extend in the first direction. Thus, the memory blocks and associated structures can extend in three directions.

Figure 3:
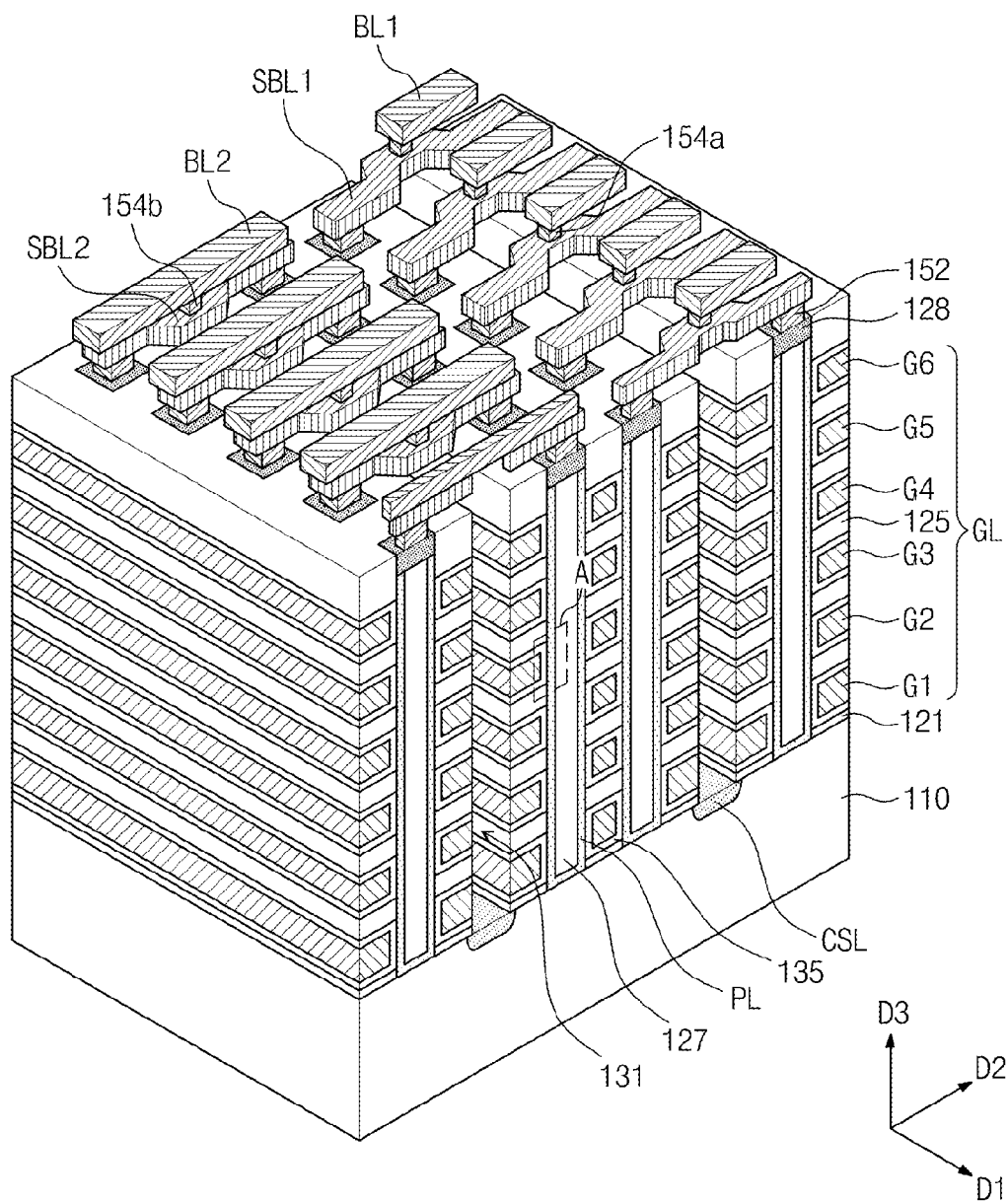
FIG. 3 is a perspective view illustrating a memory block of a vertical-type memory device according to an example of a first embodiment of the inventive concept.

FIG. 3 is a perspective view illustrating a memory block of a vertical-type memory device according to an example of a first embodiment of the inventive concept. FIGS. 4A through 4I are enlarged views illustrating a portion A of FIG. 3.

Referring to FIG. 3, a substrate 110 is provided. The substrate 110 may have a first conductivity type (for example, p-type). Gate structures GL may be provided on the substrate 110. A buffer dielectric layer 121 may be provided between the substrate 110 and the gate structures GL. The buffer dielectric layer 121 may be a silicon oxide layer or a dielectric layer formed of other suitable dielectric materials such as high-k dielectric materials.

Each of the gate structures GL may extend in a first direction. Sets of gate structures GL may face each other in a second direction different from the first direction. For example, the second direction may be substantially orthogonal to the first direction. Each of the gate structures GL may include insulating patterns 125 and gate electrodes (for example, G1-G6) spaced apart from each other with the insulating patterns interposed therebetween. The gate electrodes may include first to sixth gate electrodes G1-G6 sequentially stacked on the substrate 110. The insulating patterns 125 may be formed of or include an oxide such as silicon oxide. The buffer dielectric layer 121 may be thinner than the insulating patterns 125. The gate electrodes G1-G6 may include at least one of doped silicon, metals (e.g., tungsten), metal nitrides, metal silicides, or any combination thereof. Although six gate electrodes G1-G6 are illustrated, any number of the gate electrodes that is greater than six may be present in a gate structure GL. For example, the number of gate electrodes can be selected based on a number of memory cells and selection transistors in a cell string.

A separation region 131 extending in the first direction may be provided between the gate structures GL. The separation region 131 may be filled with a first separation insulating layer (not shown, see 141 in FIG. 5B). Common source lines CSL are provided in the substrate 110 below the separation region 131. The common source lines CSL may be spaced apart from each other and extend in the first direction. The common source lines CSL may have a second conductivity type (e.g., n-type) different from the first conductivity type. Unlike the figure, in some other embodiments, the common source lines CSL may have a linear conductive pattern provided between the substrate 110 and the first gate electrode G1 and extends in the first direction.

Vertical pillars PL are arranged in a matrix extending the first and second directions. A plurality of vertical pillars PL may be coupled with the gate structures GL. The vertical pillars PL are connected to the substrate 110. For example, the vertical pillars PL may penetrate (or extend through) the gate electrodes G1-G6 and be connected to the substrate 110. Each of the vertical pillars PL may have a major axis extending upwardly from the substrate 110 (i.e., in the third direction). Each of the vertical pillars PL may have one end coupled to the substrate 110 and an opposite end coupled to at least one of the bit lines (e.g., first or second bit lines BL1 or BL2) extending in the second direction.

Sub-interconnections SBL1 and SBL2 may be provided between the vertical pillars PL and the bit lines BL1 and BL2. Each of the sub-interconnections SBL1 and SBL2 may interconnect the adjacent vertical pillars PL, which are coupled with immediately adjacent gate structures GL, via lower contacts 152. The bit lines BL1 and BL2 may be connected to the sub-interconnections SBL1 and SBL2 via upper contacts 154a and 154b.

A plurality of cell strings of a non-volatile memory devices such as flash memory device are provided between the bit lines BL1 and BL2 and the common source line CSL. One single cell string may include a string selection transistor connected to the bit lines BL1 and BL2, a ground selection transistor connected to the common source lines CSL, and a plurality of memory cells provided between the string selection transistor and the ground selection transistor. The selection transistors and the plurality of memory cells may be provided corresponding to a single vertical pillar PL. A first gate electrode G1 may be a ground selection line GSL of the ground selection transistor. Second to fifth gate electrodes G2-G6 may be cell gates WL of the memory cells. A sixth gate electrode G6 may be a string selection line SSL of the string selection transistor.

A memory element 135 may be provided between the first to sixth gate electrodes G1-G6 and the vertical pillars PL. Although it is shown in FIG. 3 that the memory element 135 extends between the gate electrodes G1-G6 and the insulating patterns 125 and between the gate electrodes G1-G6 and the vertical pillars PL, the location and the shape of the memory element 135 is not limited thereto. In embodiments described later, the memory element 135 may be modified in various ways (see FIGS. 4A to 4I).

In one aspect, the vertical pillars PL may include a semiconductor material. Accordingly, the vertical pillars PL may function as channels of transistors. The vertical pillars PL may be solid-cylindrical pillars or hollow-cylindrical (e.g., macaroni-type) pillars. In the case where the vertical pillars PL is shaped like a hollow cylinder, a filling insulating layer 127 may fill in the hollow vertical pillars. The filling insulating layer 127 may include silicon oxide. The filling insulating layer 127 may be in direct contact with the inner wall of the vertical pillars PL. Conductive patterns 128 may be provided on respective ends of the vertical pillars PL. Ends of the vertical pillars PL in contact with the conductive patterns 128 may function as drain regions of the string selection transistors.

Figure 4A:
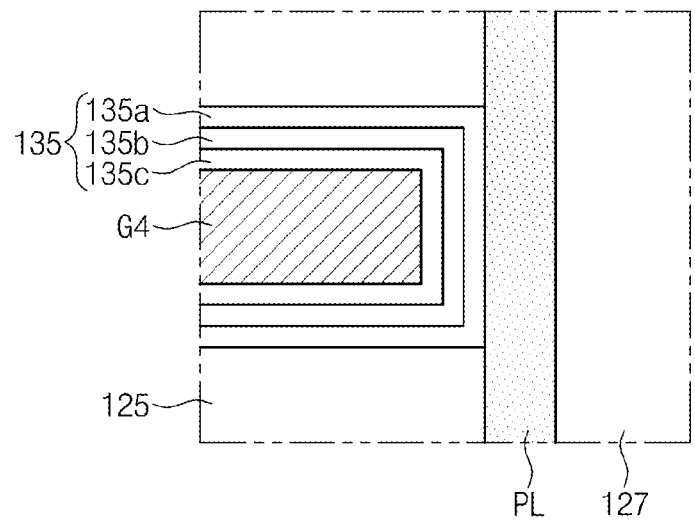
FIGS. 4A through 4I are enlarged views illustrating a portion A of FIG. 3.

As an example, referring to FIG. 4A, similar to FIG. 3, the memory element 135 may include a blocking insulating layer 135c adjacent to gate electrodes G1-G6, a tunnel insulating layer 135a adjacent to the vertical pillars PL, and a charge storage layer 135b disposed between the blocking insulating layer 135c and the tunnel insulating layer 135a. The memory element 135 may be provided between the gate electrodes G1-G6 and the vertical pillars PL and extend between the gate electrodes G1-G6 and the insulating patterns 125. The blocking insulating layer 135c may include a high-k dielectric (e.g., aluminum oxide or hafnium oxide). The blocking insulating layer 135c may be a multi-layered film comprising a plurality of thin films. For example, the blocking insulating layer 135c may include aluminum oxide and/or hafnium oxide and there may be various stacked orders of aluminum oxide and hafnium oxide. The charge storage layer 135b may be an insulating layer including a charge trapping layer, conductive nanoparticles, or the like. The charge trapping layer may include, for example, silicon nitride. The tunnel insulating layer 135a may include silicon oxide or other suitable dielectric materials.

Figure 4B:
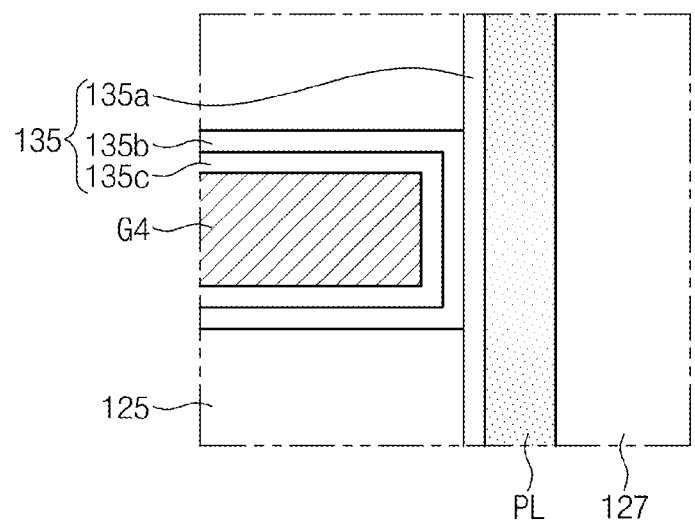
Figure 4C:
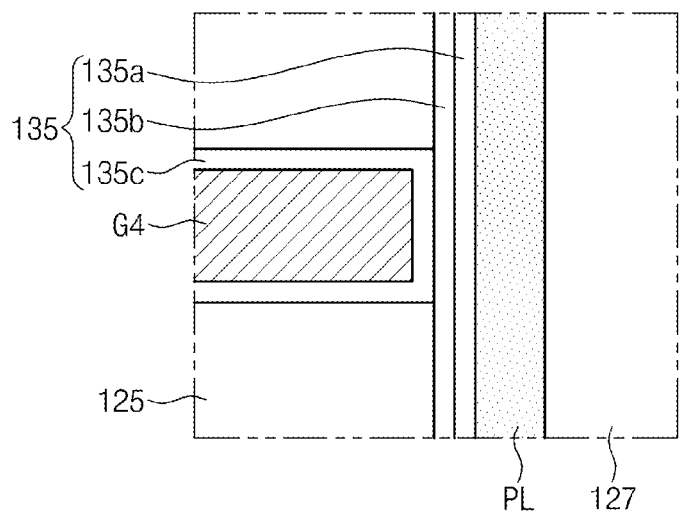
Figure 4D:
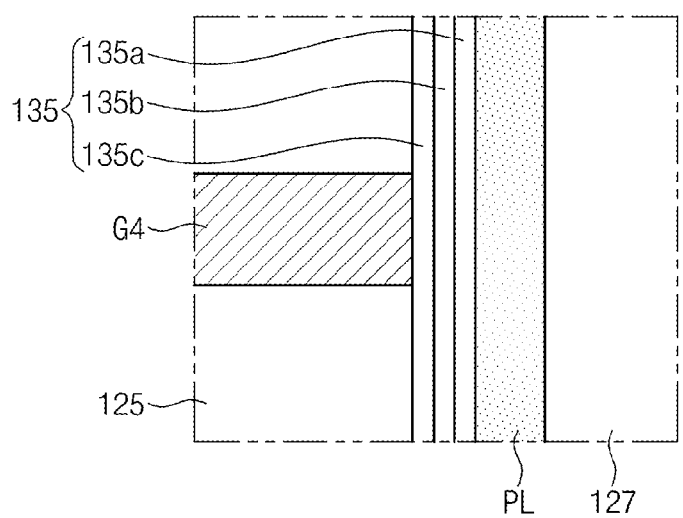

As shown in FIGS. 4B through 4D, some portions of the memory element 135 may not extend between the insulating patterns 125 and the gate electrodes G1-G6, unlike FIG. 3, but some other portions of the memory element 135 may still extend between the gate electrodes G1-G6 and the vertical pillars PL. As shown in FIG. 4B, the tunnel insulating layer 135a may extend between the insulating patterns 125 and the vertical pillars PL, while the charge storage layer 135b and the blocking insulating layer 135c may extend between the insulating patterns 125 and the gate electrodes G1-G6.

As shown in FIG. 4C, some portions of the tunnel insulating layer 135a and the charge storage layer 135b may extend between the insulating patterns 125 and the vertical pillars PL, while some portions of the blocking insulating layer 135c may extend between the insulating patterns 125 and the gate electrodes G1-G6.

Referring to FIG. 4D, the tunnel insulating layer 135a, the charge storage layer 135b, and the blocking insulating layer 135c may extend between the insulating patterns 125 and the vertical pillars PL, while the insulating patterns 125 directly contact the gate electrodes G1-G6.

Figure 4E:
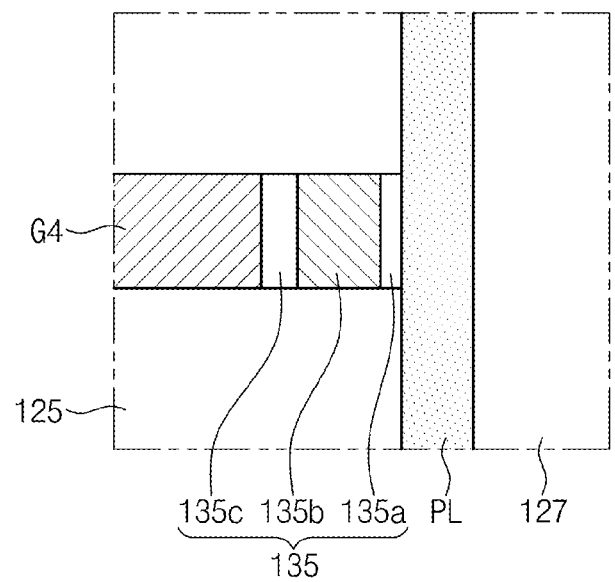

Different from the above examples, as shown in FIG. 4E, the charge storage layer 135b may include polysilicon. In this case, the tunnel insulating layer 135a, the charge storage layer 135b, and the blocking insulating layer 135c may be disposed between the gate electrodes G1-G6, the vertical pillars PL, and the insulating patterns 125.

In another aspect, the vertical pillars PL may be conductive pillars. The vertical pillars PL may include at least one of conductive materials, e.g., a doped semiconductor, a metal, conductive metal nitride, silicide or nanostructures (such as carbon nanotube or graphene).

Figure 4F:
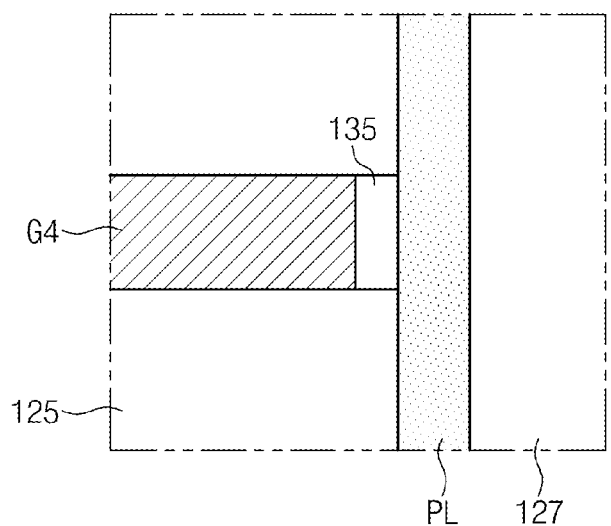

Referring to FIG. 4F, the memory element 135 may be disposed between the gate electrodes G1-G6, the vertical pillars PL, and the insulating patterns 125.

Figure 4G:
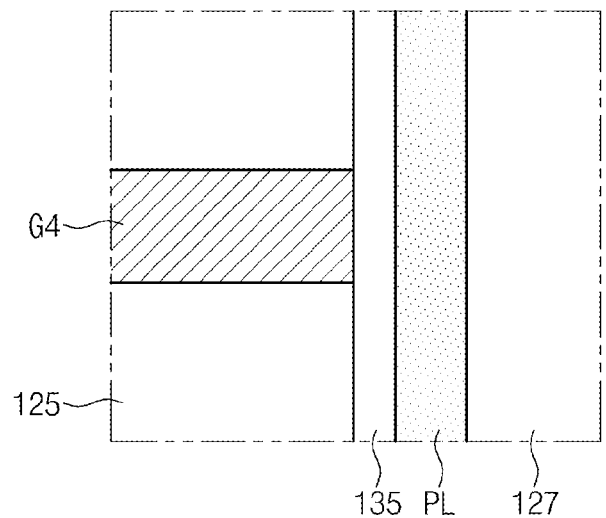
Figure 4H:
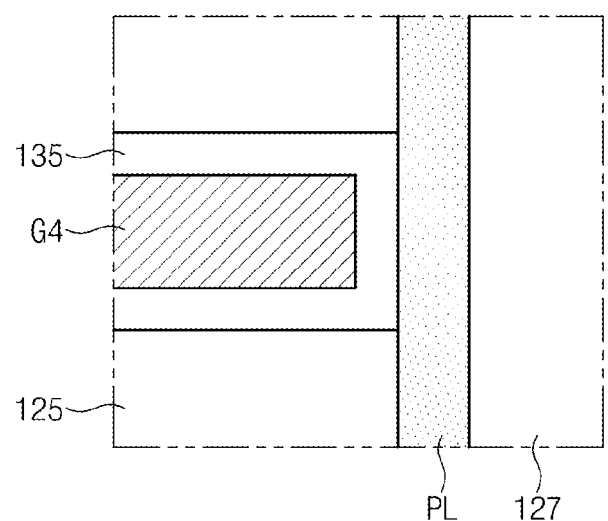

Referring to FIGS. 4G and 4H, the memory element 135 may extend between the insulating patterns 125 and the vertical pillars PL or between the insulating patterns 125 and the gate electrodes G1-G6. In this case, the memory element 135 may be a variable resistance pattern. The variable resistance pattern may include at least one of materials exhibiting a variable resistance property. Hereinafter, examples of a variable resistance pattern used as the memory element 135 will be explained below.

As an example, the memory element 135 may include a material (for example, a phase-changeable material), whose electric resistance may be varied depending on heat generated by current passing through its adjacent electrode. The phase-changeable material may be a material including at least one of antimony (Sb), tellurium (Te), or selenium (Se). For example, the phase-changeable material may include a chalcogenide formed of tellurium (Te) having about 20 to about 80 atomic percent concentration, antimony (Sb) having about 5 to about 50 atomic percent concentration, and germanium (Ge) having the remaining concentration. In addition, the phase-changeable material may further include impurities of at least one of N, O, C, Bi, In, B, Sn, Si, Ti, Al, Ni, Fe, Dy, or La. In example embodiments, the memory element 135 may be formed of one of GeBiTe, InSb, GeSb, and GaSb.

As other example, the memory element 135 may be configured to have a layered structure whose electric resistance may be changed using a spin transferring phenomenon of an electric current flowing through the memory element 135. For example, the memory element 135 may be configured to have a layered structure exhibiting a magneto-resistance property and include at least one ferromagnetic material and/or at least one antiferromagnetic material. The memory element 135 may thus include a free layer and a reference layer. For example, the memory element 135 may be a magnetic tunnel junction device comprising a free layer structure, a reference layer (or pinned layer), and a tunnel barrier therebetween.

In some other embodiments, the memory element 135 may include at least one of perovskite compounds or transition metal oxides. For example, the memory element 135 may include at least one of niobium oxide, titanium oxide, nickel oxide, zirconium oxide, vanadium oxide, PCMO((Pr,Ca)MnO$_3$), strontium-titanium oxide, barium-strontium-titanium oxide, strontium-zirconium oxide, barium-zirconium oxide, or barium-strontium-zirconium oxide.

Figure 4I:
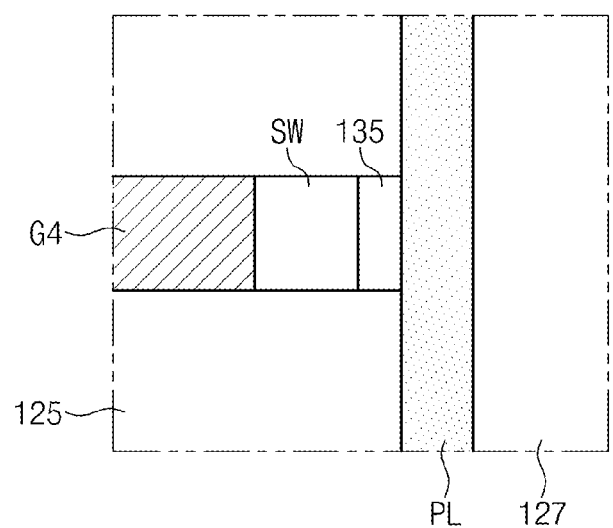

According to example embodiments of the inventive concept, as shown in FIG. 4I, a switching element SW may be interposed between the memory element 135 and the gate electrodes G1-G6. The switching element SW may be formed of a material exhibiting a self-rectifying property or a nonlinear current-voltage property. For example, the switching element SW may be configured to form a pn-junction diode.

Figure 5A:
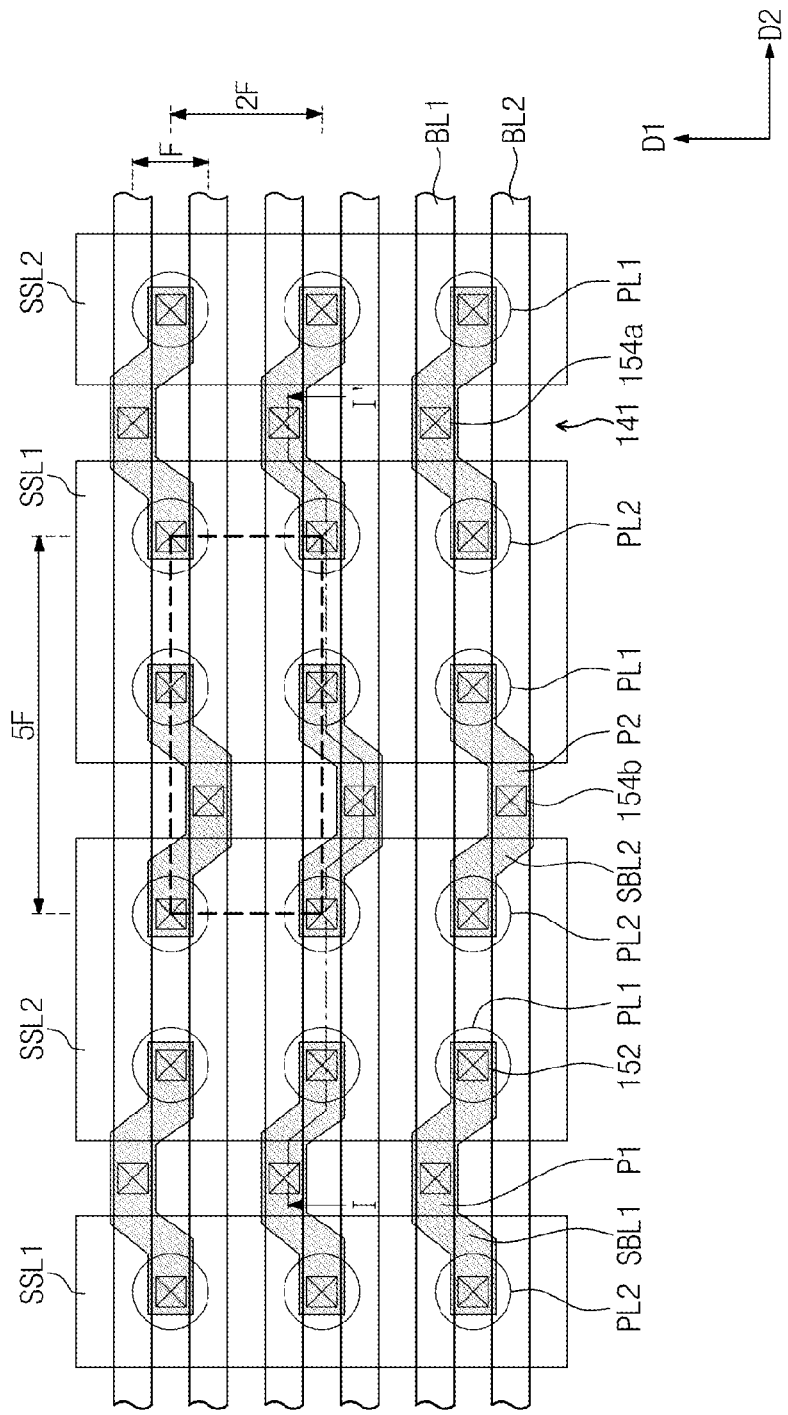
FIG. 5A is a plan view of the vertical-type memory device of FIG. 3.
Figure 5B:
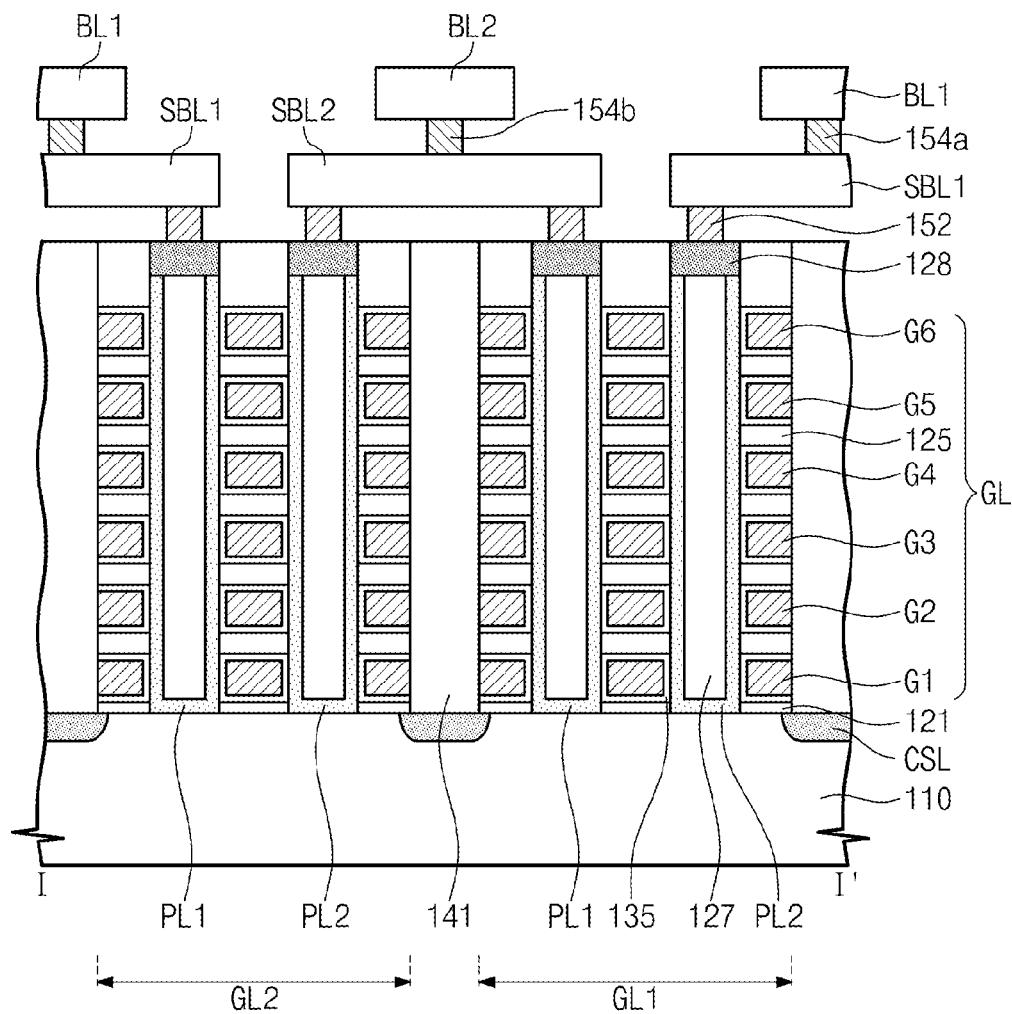
FIG. 5B is a sectional view taken along line I-I' of FIG. 5A.

FIG. 5A is a plan view of the vertical-type memory device of FIG. 3, and FIG. 5B is a cross-sectional view taken along line I-I' of FIG. 5A. With reference to FIGS. 5A and 5B, a vertical type memory device according to an example of a first embodiment of the inventive concept will now be described in detail.

Referring to FIGS. 5A and 5B, the gate structures GL may include first and second gate structures GL1 and GL2 adjacent to each other. Hereinafter, the sixth gate electrode G6 of the first gate structure GL1 will be referred to as a first string selection line SSL1, and the sixth gate electrode G6 of the second gate structure GL2 will be referred to as a second string selection line SSL2. The first and second string selection lines SSL1 and SSL2 may be alternately arranged in the second direction.

The vertical pillars coupled to each of the first and second string selection lines SSL1 and SSL2 may include first and second vertical pillars PL1 and PL2. Here, the first vertical pillars PL1 are arranged substantially parallel to the first direction D1 to constitute a first column, and the second vertical pillars PL2 are arranged substantially parallel to the first direction D1 to constitute a second column. In other words, the first and second columns may be spaced apart from each other in the second direction D2. In plan view, the first and second vertical pillars PL1 and PL2 may be arranged on each of the first and second string selection lines SSL1 and SSL2 to form a matrix-shaped arrangement. A pair of the vertical pillars adjacent in the first direction D1 may be spaced apart from each other by, for example, two pitches (2F) of each of the bit lines BL1 and BL2.

Each of the sub-interconnections may be disposed to connect two adjacent vertical pillars PL1 and PL2, one of which is coupled to the first string selection line SSL1, and the other of which is coupled to the second string selection line SSL2. Thus, sub-interconnections may interconnect vertical pillars PL1 and PL2 that are coupled to different string selection lines SSL. The sub-interconnections may include first sub-interconnections SBL1 and second sub-interconnections SBL2. Each of the first sub-interconnections SBL1 may connect one of the second vertical pillars PL2 coupled to one of the first string selection lines SSL1 to a corresponding one of the first vertical pillars PL1 coupled to one of the second string selection lines SSL2, while each of the second sub-interconnections SBL2 may connect one of the second vertical pillars PL2 coupled to one of the second string selection lines SSL2 to a corresponding one of the first vertical pillars PL1 coupled to another of the first string selection lines SSL1.

The sub-interconnections SBL1 and SBL2 may be optionally connected to the vertical pillars PL1 and PL2 via the lower contacts 152. In plan view, each of the lower contacts 152 may be overlapped with a corresponding one of the vertical pillars PL1 and PL2. The first and second sub-interconnections SBL1 and SBL2 may extend along the second direction D2. In some embodiments, each of the first sub-interconnections SBL1 may include a first protrusion P1 protruding in the first direction D1, and each of the second sub-interconnections SBL2 may include a second protrusion P2 protruding in a direction opposite to the first direction D1. The protrusions P1 and P2 may be positioned on the separation insulating layer 141 and between the gate structures GL1 and GL2.

The first sub-interconnections SBL1 may be arranged along the first direction to form a group of columns. The second sub-interconnections SBL2 may be arranged along the first direction to form another columnar arrangement. The columns of the first and second sub-interconnections SBL1 and SBL2 may be alternatingly disposed along the second direction. A pair of the first and second sub-interconnections SBL1 and SBL2 disposed adjacent to each other in the second direction may be respectively connected to different ones, adjacent to each other in the first direction, of the bit lines. For example, each of the first bit lines BL1 may be connected in common to a plurality of the first sub-interconnections SBL1 arranged in the second direction D2, and each of the second bit lines BL2 may be connected in common to a plurality of the second sub-interconnections SBL2 arranged in the second direction D2.

The bit lines BL1 and BL2 may be connected to the sub-interconnections SBL1 and SBL2, respectively, via the upper contacts 154a and 154b. Each of the upper contacts 154a and 154b may be provided between the gate structures GL1 and GL2 and on the separation insulating layer 141. In some embodiments, alternatively, the upper contacts 154a and/or 154b may not need to be formed on the separation insulating layer 141. The first upper contact 154a on the first sub-interconnection SBL1 may be shifted from the lower contacts 152 by, for example, a distance equal to half the pitch of the bit lines BL1 and BL2 in the first direction, and the second upper contact 154b on the second sub-interconnection SBL2 may be shifted from the lower contacts 152 by, for example, a distance equal to half the pitch of the bit lines BL1 and BL2, in the direction opposite to the first direction. The upper contacts 154a and 154b may be provided on the protrusions P1 and P2, respectively.

Hereinafter, a method of fabricating the vertical-type memory device of FIG. 3 will be described with reference to FIGS. 6A through 11A and FIGS. 6B through 11B according to some embodiments of the inventive concept. Here, FIGS. 6A through 11A are plan views illustrating a process of fabricating the vertical-type memory device of FIGS. 5A and 5B, and FIGS. 6B through 11B are sectional views taken along line I-I' of FIGS. 6A through 11A, respectively.

Figure 6A:
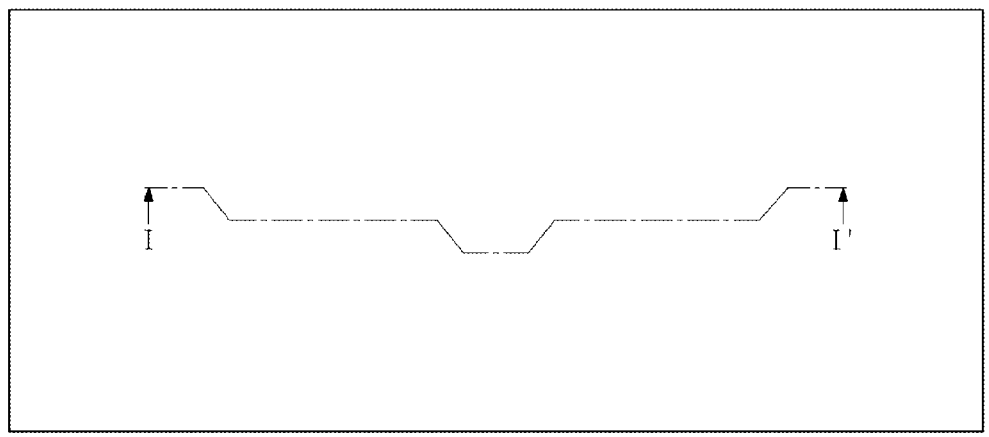
Figure 6B:
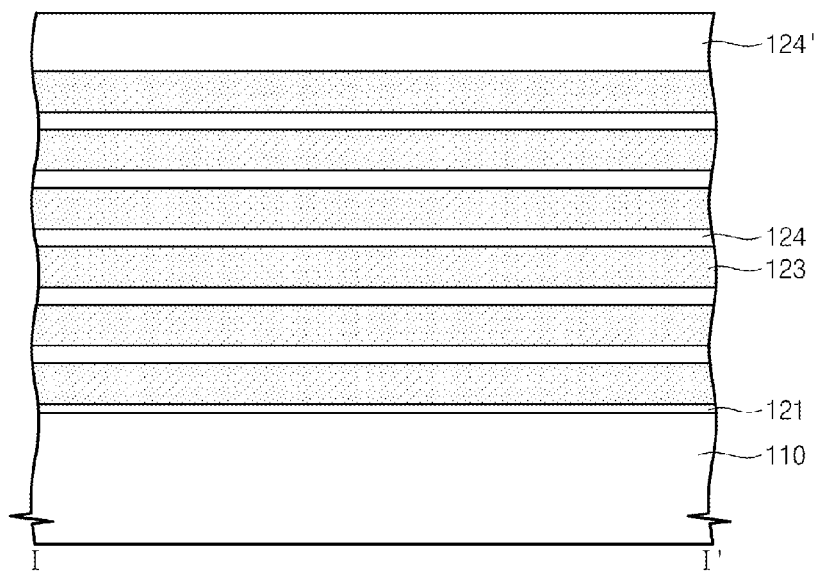

Referring to FIGS. 6A and 6B, a substrate 110 is provided. The substrate 110 may have a first conductivity type, e.g., P-type. A buffer dielectric layer 121 may be formed on the substrate 110. The buffer dielectric layer 121 may include, for example, silicon oxide. The buffer dielectric layer 121 may be formed by, for example, a thermal oxidation process. Sacrificial layers 123 and insulating layers 124 are alternately stacked on the buffer dielectric layer 121. The thickness of an uppermost insulating layer 124' may be greater than those of the other insulating layers 124. The insulating layers 124, 124' may include, for example, silicon oxide. The sacrificial layer 123 may include materials having different wet etch properties (etch selectivity) with respect to the buffer dielectric layer 121 and the insulating layers 124. The sacrificial layers 123 may include, for example, silicon nitride, silicon oxynitride, polysilicon or polysilicon germanium. The sacrificial layers 123 and the insulating layers 124 may be formed by, for example, chemical vapor deposition (CVD).

Figure 7A:
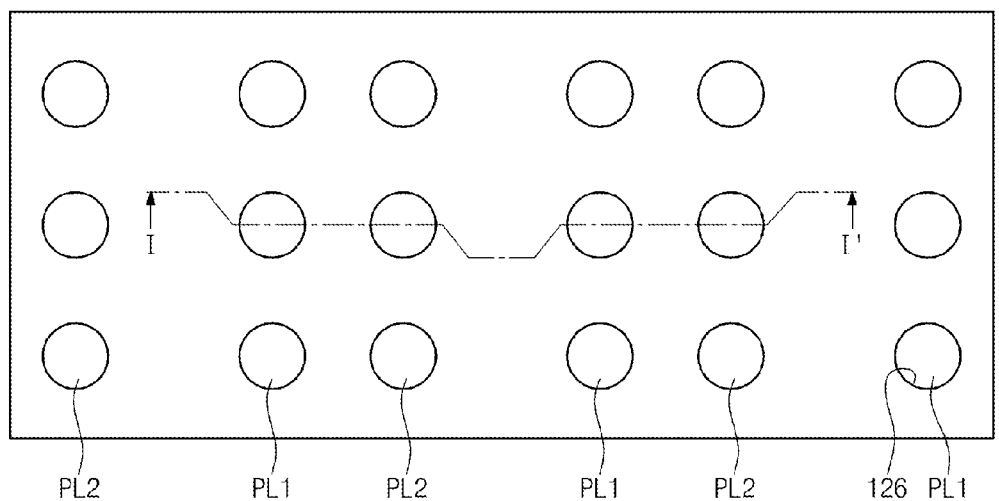
Figure 7B:
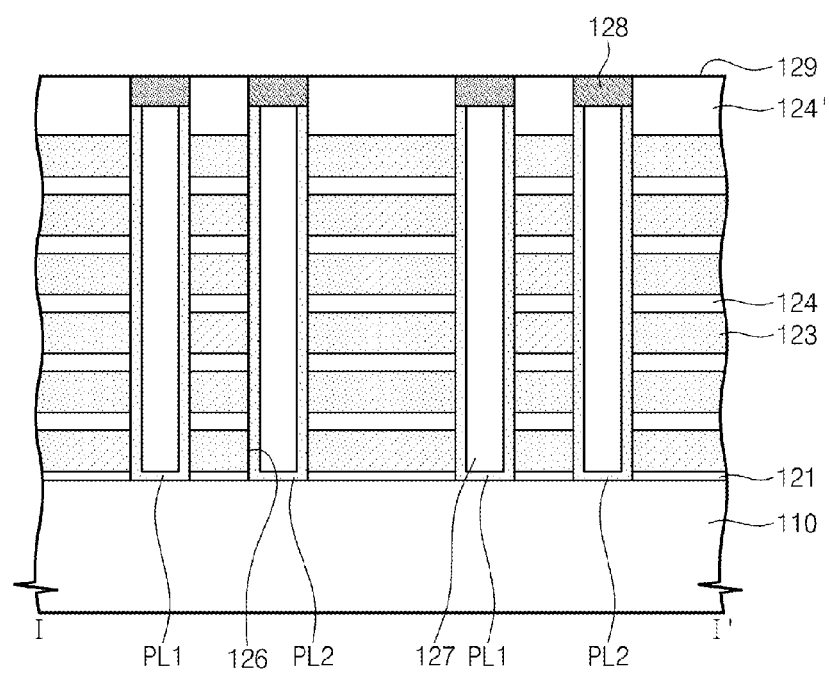

Referring to FIGS. 7A and 7B, vertical holes 126 are formed to expose portions of the substrate 110, passing through the buffer dielectric layer 121, the sacrificial layers 123, and the insulating layers 124. The vertical holes 126 may be disposed in the same manner as the vertical pillars PL1 and PL2 as explained with reference to FIG. 5A.

Vertical pillars PL1 and PL2 may be formed in the vertical holes 126. In one aspect, the vertical pillars PL1 and PL2 may be semiconductor layers of a first conductivity type. The semiconductor layer may not fill up (i.e., partially fill) the vertical holes 126, and an insulating material may be formed on the semiconductor layer to fill up the vertical holes 126. The semiconductor layer and the insulating material may be planarized to expose the uppermost insulating layer 124'. Thus, cylindrical vertical pillars PL1 and PL2 may be formed having an inside filled with a filling insulating layer 127. Alternatively, the semiconductor layer may be formed to fill the vertical holes 126. In this case, the filling insulating layer may not be required.

Upper portions of the vertical pillars PL1 and PL2 may be recessed to be lower than a top surface 129 of the uppermost insulating layer 124'. Conductive patterns 128 may be formed in the vertical holes 126 in which top portions of the vertical pillars PL1 and PL2 are recessed. The conductive patterns 128 may be formed of a conductive material such as doped polysilicon or a metal. Drain regions may be formed by introducing impurities of second conductivity type into the conductive patterns 128 and upper portions of the vertical pillars PL1 and PL2. The second conductivity type may be n-type.

In another aspect, the vertical pillars PL1 and PL2 may include at least one of conductive materials, e.g., a doped semiconductor, a metal, conductive metal nitride, silicide or nanostructures (such as carbon nanotube or graphene).

Figure 8A:
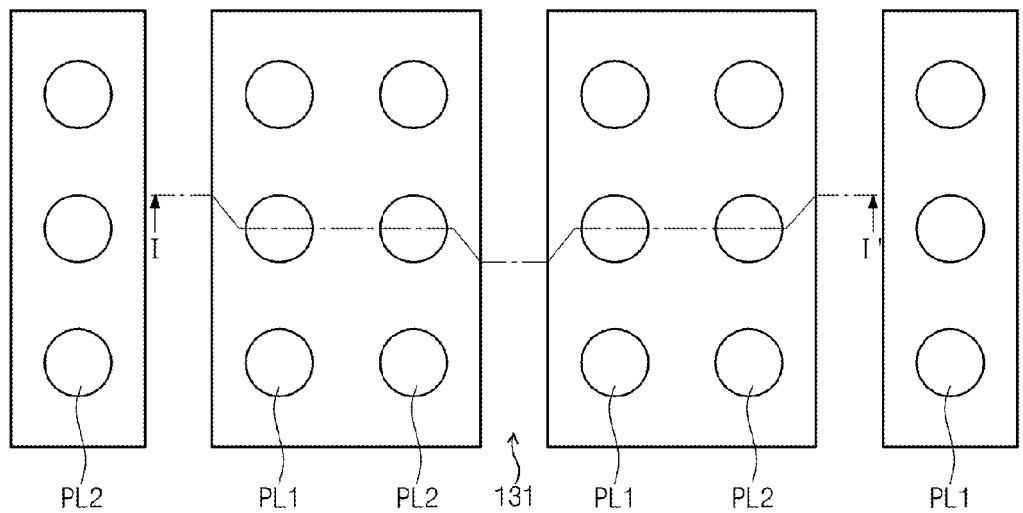
Figure 8B:
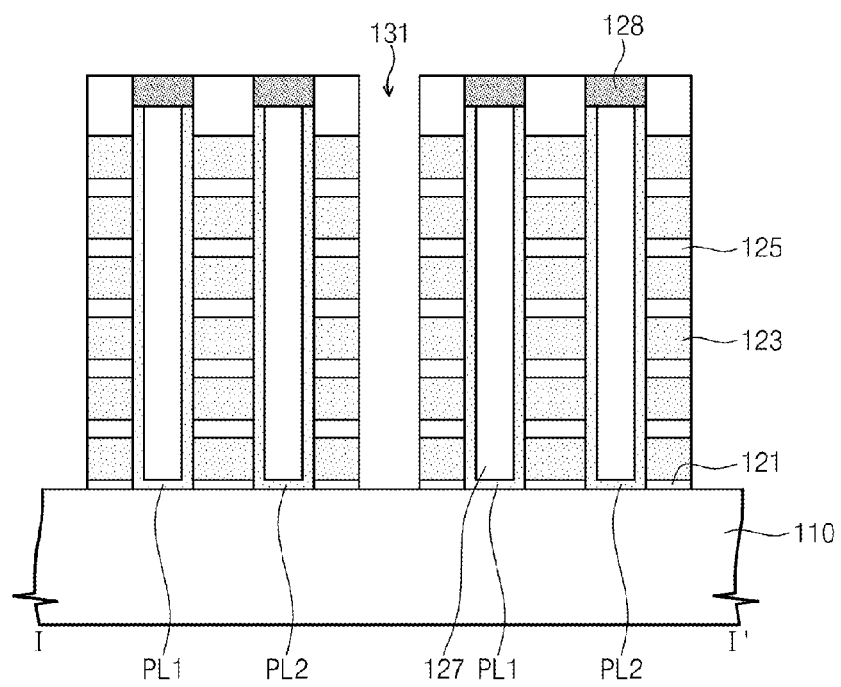

Referring to FIGS. 8A and 8B, the buffer dielectric layer 121, the sacrificial layers 123, and the insulating layers 124, 124' are successively patterned to form separation regions 131 that are spaced apart from each other, extend in a first direction, and expose a portion of the substrate 110. The patterned insulating layers 124 may become insulating patterns 125.

Figure 9A:
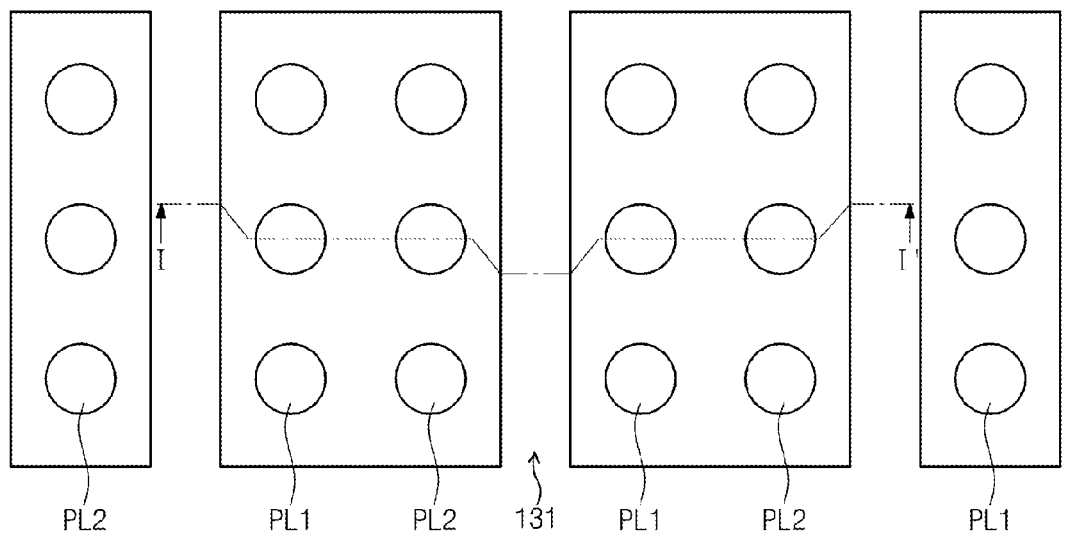
Figure 9B:
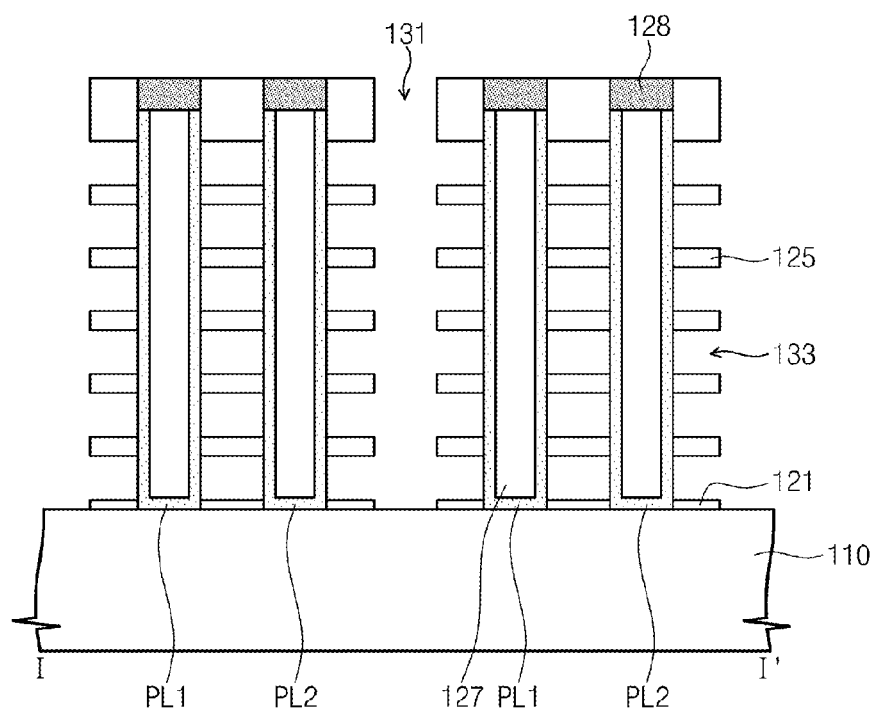

Referring to FIGS. 9A and 9B, the patterned sacrificial layers 123 exposed to the separation regions 131 are selectively removed to form gate regions 133. The gate regions 133 correspond to regions in which the sacrificial layers 123 are removed and are defined by sidewalls of the vertical pillars PL1 and PL2 and top and bottom surfaces of the insulating patterns 125. If the sacrificial layers 123 include silicon nitride or silicon oxynitride, the sacrificial layers 123 may be removed using an etchant containing phosphoric acid. Portions of the sidewalls of the vertical pillars PL1 and PL2 are exposed to the gate regions 133.

Figure 10A:
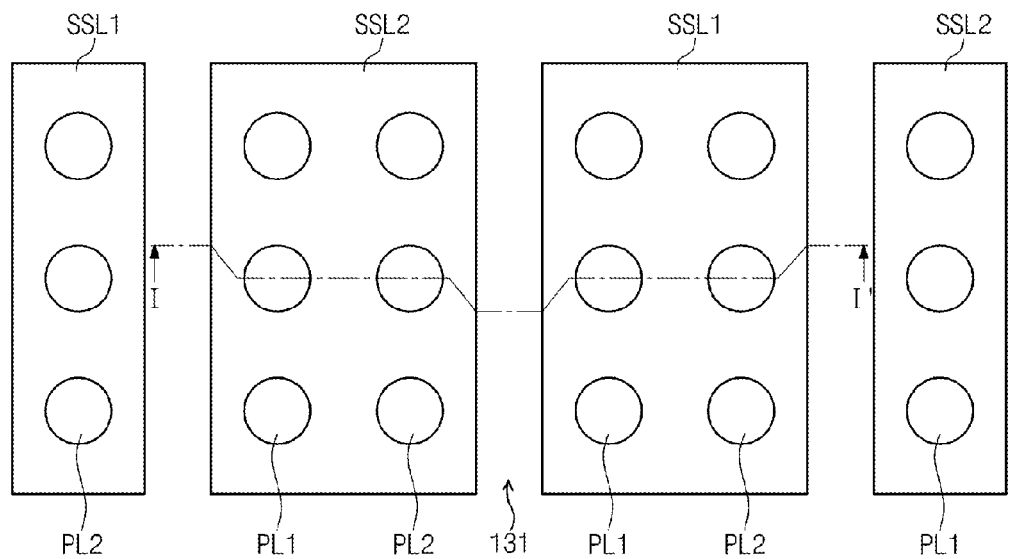
Figure 10B:
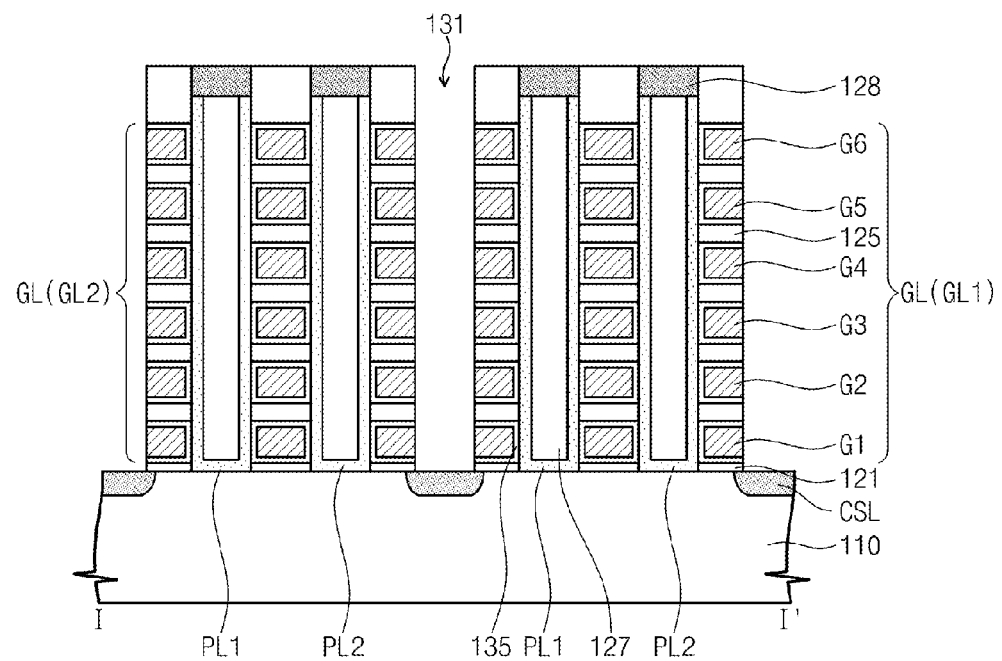

Referring to FIGS. 10A and 10B, the memory element 135 is formed in the gate regions 133. In one embodiment, the memory element 135 may include a tunnel insulating layer contacting the sidewalls of the vertical pillars PL1 and PL2, a charge storage layer on the tunnel insulating layer, and a blocking insulating layer on the charge storage layer (see, for example, FIG. 4A). In this case, the vertical pillars PL1 and PL2 may be semiconductor pillars. The tunnel insulating layer may include a dielectric material such as silicon oxide. The tunnel insulating layer may formed by thermally oxidizing the vertical pillars PL1 and PL2 exposed to the gate regions 133. Alternatively, the tunnel insulating layer may be formed by an atomic layer deposition (ALD) process. The charge storage layer may be a charge trapping layer or an insulating layer including conductive nanoparticles. The charge trapping layer may include, for example, silicon nitride. The blocking insulating layer may include high-k dielectric (e.g., aluminum oxide or hafnium oxide). The blocking insulating layer may be a multi-layered film comprising a plurality of thin films. For example, the blocking insulating layer may include aluminum oxide and silicon oxide, and there may be various stacked orders of aluminum oxide and silicon oxide. The charge storage layer and the blocking insulating layer may be formed by the ALD process with superior step coverage and/or a chemical vapor deposition (CVD) process. Alternatively, when the memory element 135 has a structure shown in FIGS. 4B through 4E, at least one of the tunnel insulating layer, the charge storage layer and/or the blocking insulating layer, collectively constituting the memory element 135, may be formed in the vertical holes 126 before formation of the vertical pillars PL1 and PL2.

In some other embodiments, the memory element 135 may be a variable resistance pattern (see FIGS. 4F through 4H). The variable resistance pattern may include at least one of materials having variable resistance characteristics, i.e., its resistance being variable depending on current passing therethrough. In this case, the vertical pillars PL1 and PL2 may be conductive pillars including conductive materials (e.g., a doped semiconductor, a metal, conductive metal nitride, silicide or nanostructures (such as carbon nanotube or grapheme)). When the memory element 135 has the structure shown in FIG. 4G, the memory element 135 may be formed in the vertical holes 126 before forming the vertical pillars PL1 and PL2.

A conductive layer is formed on the memory element 135 in the gate regions 133. The conductive layer may be formed of at least one of doped silicon, a metal (e.g., tungsten), metal nitride, and metal silicide. The metal conductive layer may be formed by the ALD process. When the conductive layer is a metal silicide layer, the conductive layer may be formed by forming a polysilicon layer, removing a portion of the polysilicon layer adjacent to a separation region 131 to recess the polysilicon layer, forming a metal layer on the recessed polysilicon layer, thermally treating the metal layer, and removing a non-reacting metal layer. The metal layer for the metal silicide layer may include tungsten, titanium, cobalt or nickel.

The conductive layer formed outside of the gate regions 133 (i.e., in the separation region 131) is removed. Thus, gate electrodes G1-G6 are formed in the gate regions 133. The gate electrodes G1-G6 extend in a first direction. Gate structures GL may include the gate electrodes G1-G6. The gate structures GL may include first and second gate structures GL1 and GL2 that are alternately arranged in the second direction.

The first and second vertical pillars PL1 and PL2 arranged in a matrix of the first and second directions may be coupled with one of the gate structures GL1 and GL2.

The conductive layer formed in the separation regions 131 may be removed to expose portions of the substrate 110. Impurities of a second conductivity type may be heavily introduced into the exposed portions of the substrate 110 to form common source lines CSL.

Figure 11A:
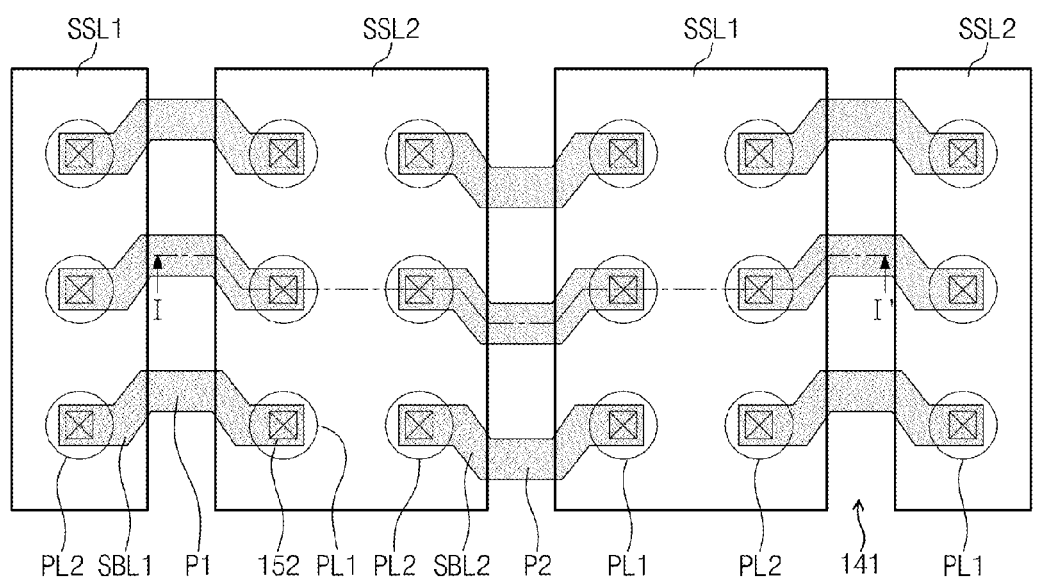
Figure 11B:
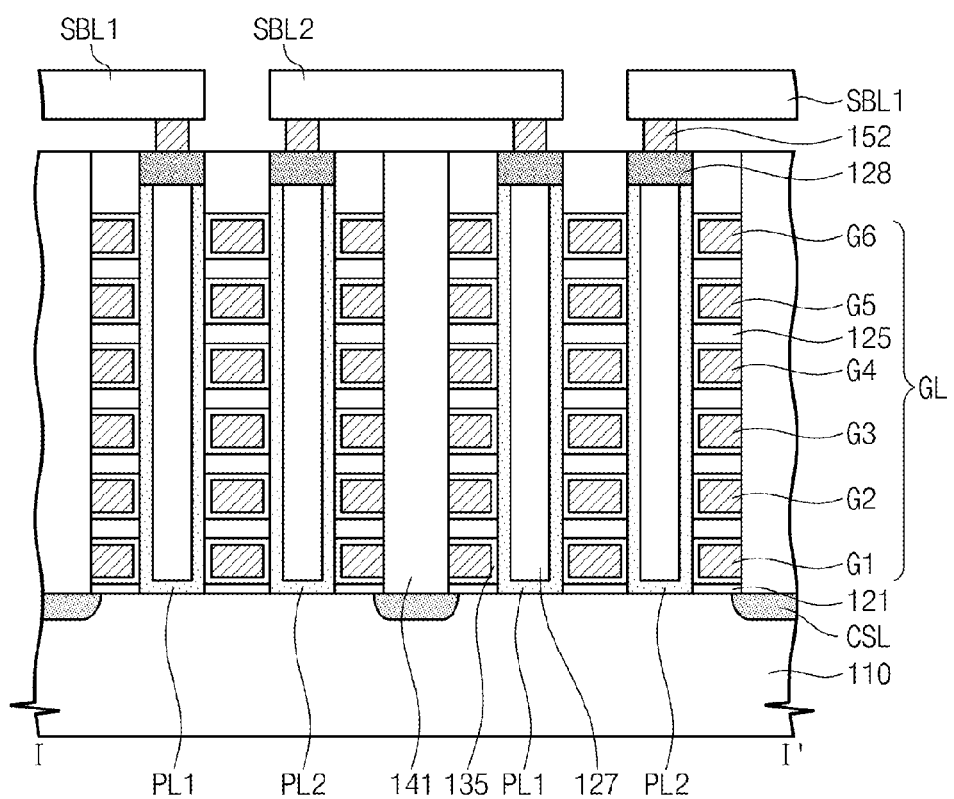

Referring to FIGS. 11A and 11B, a separation insulating layer 141 is formed to fill the separation regions 131. Lower contacts 152 may be formed on and overlapped with the vertical pillars PL1 and PL2. Sub-interconnections SBL1 and SBL2 may be formed on the lower contacts 152. The sub-interconnections SBL1 and SBL2 may connect the vertical pillars PL1 and PL2 coupled to adjacent string selection lines SSL1 and SSL2, respectively, through the lower contacts 152.

Referring back to FIGS. 5A and 5B, the first and second upper contacts 154a and 154b may be formed on the first and second sub-interconnections SBL1 and SBL2, respectively. The bit lines BL1 and BL2 may be formed on the first and second upper contacts 154a and 154b. The first and second sub-interconnections SBL1 and SBL2 may be connected to other adjacent bit lines via the first and second upper contacts 154a and 154b. The first sub-interconnection SBL1 may be connected to the first bit line BL1 via the first upper contact 154a. The second sub-interconnection SBL2 may be connected to the second bit line BL2 via the second upper contact 154b.

Figure 12A:
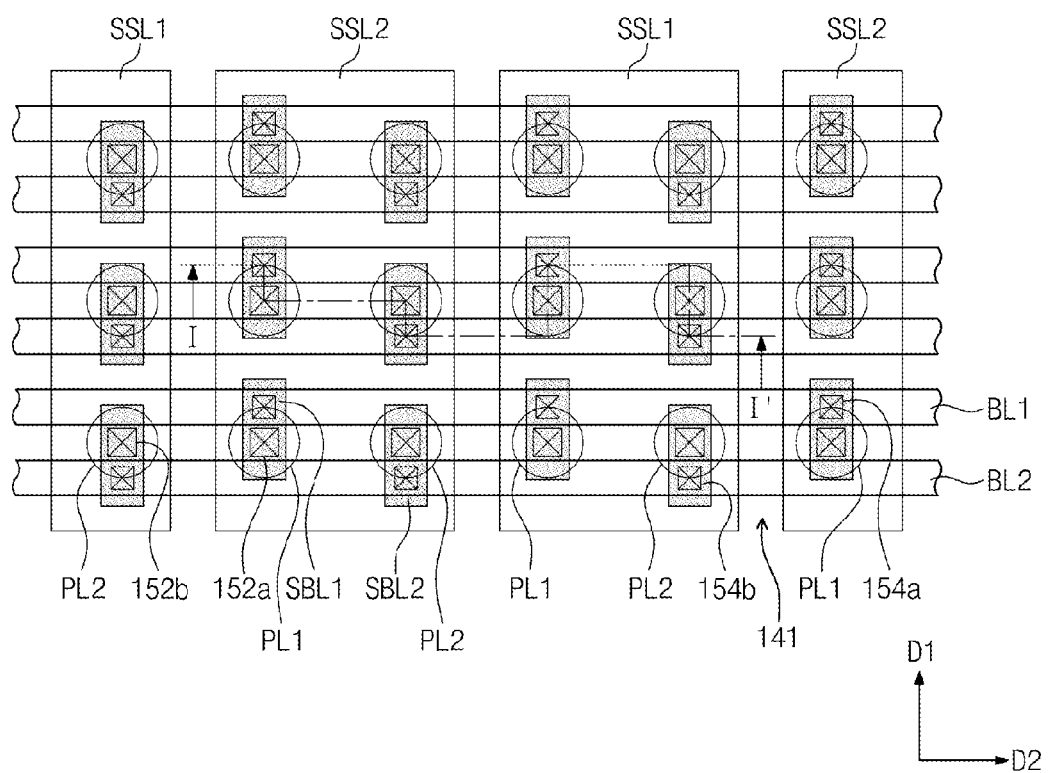
FIG. 12A is a plan view illustrating a vertical-type memory device according to other example of the first embodiment of the inventive concept.
Figure 12B:
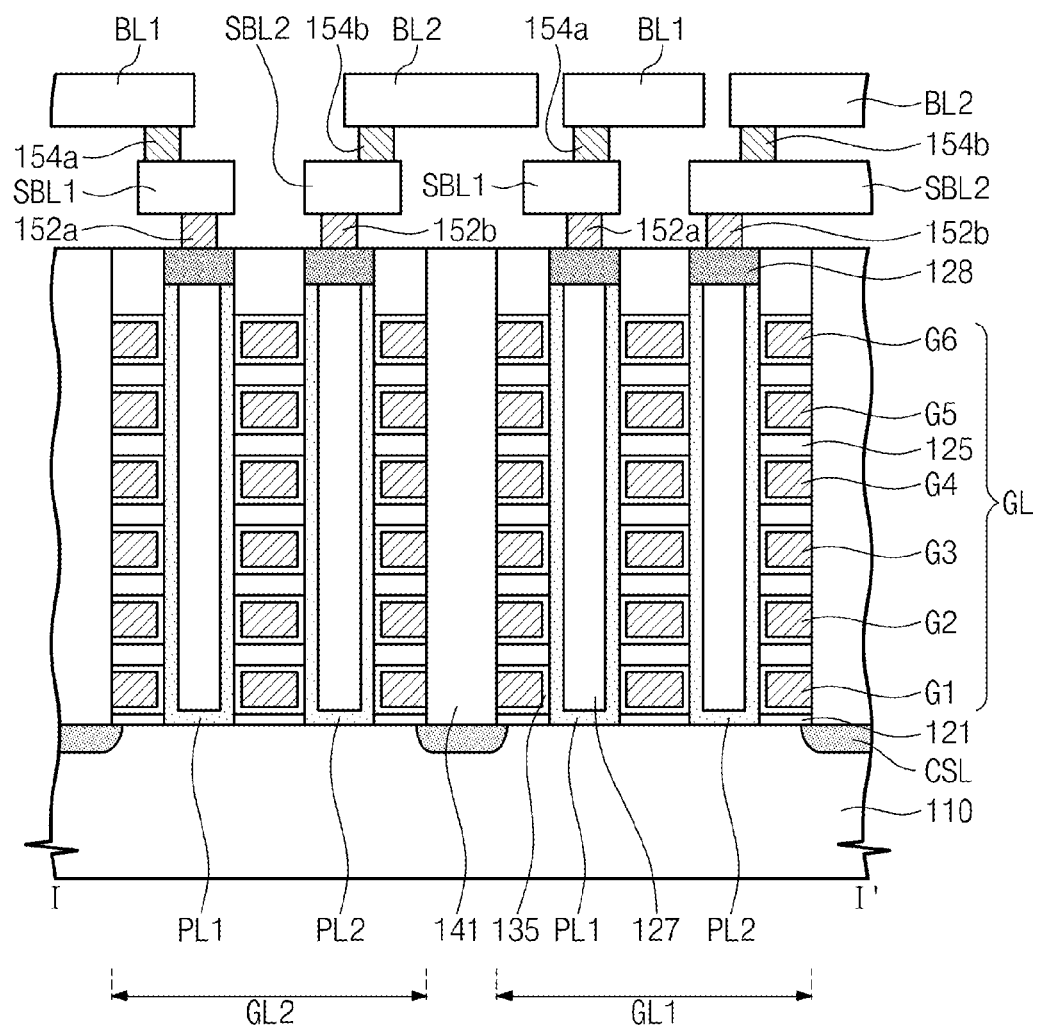
FIG. 12B is a sectional view taken along line I-I' of FIG. 12A.

FIG. 12A is a plan view illustrating a vertical-type memory device according to another example of the first embodiment of the inventive concept, and FIG. 12B is a cross-sectional view taken along line I-I' of FIG. 12A. The elements and features of this example that are identical or similar to those previously shown and described with reference to FIGS. 3, 5A, and 5B may be omitted for a concise description, and differences therebetween will be described with reference to FIGS. 12A and 12B.

Referring to FIGS. 12A and 12B, the sub-interconnections may include the first sub-interconnection SBL1 and the second sub-interconnection SBL2. In the present embodiments, the first sub-interconnection SBL1 may be connected to the first vertical pillar PL1 via a first lower contact 152a overlapped with the first vertical pillar PL1. The second sub-interconnection SBL2 may be connected to the second vertical pillar PL2 via a second lower contact 152b overlapped with the second vertical pillar PL2.

The first sub-interconnections SBL1 may be arranged along the first direction. The second sub-interconnections SBL2 may be arranged along the first direction. The columns of the first and second sub-interconnections SBL1 and SBL2 may be alternatingly disposed along the second direction. The first and second sub-interconnections SBL1 and SBL2 may be connected to different bit lines. Each of the bit lines may be connected in common to a plurality of the first sub-interconnections SBL1 or a plurality of the second sub-interconnections SBL2.

The first sub-interconnection SBL1 may be connected to the first bit line BL1 via the first upper contact 154a, which is offset from the first vertical pillar PL1 in the first direction. The second sub-interconnection SBL2 may be connected to the second bit line BL2 via the second upper contact 154b, which is offset from the second vertical pillar PL2 in the direction opposite to the first direction.

The first upper contact 154a on the first sub-interconnection SBL1 may be shifted from the first lower contact 152a by, for example, a distance equal to half the pitch of the bit lines BL1 and BL2, in the first direction. The second upper contact 154*b* on the second sub-interconnection SBL2 may be shifted from the second lower contact 152*b* by, for example, a distance equal to half the pitch of the bit lines BL1 and BL2, in the direction opposite to the first direction.

Figure 13A:
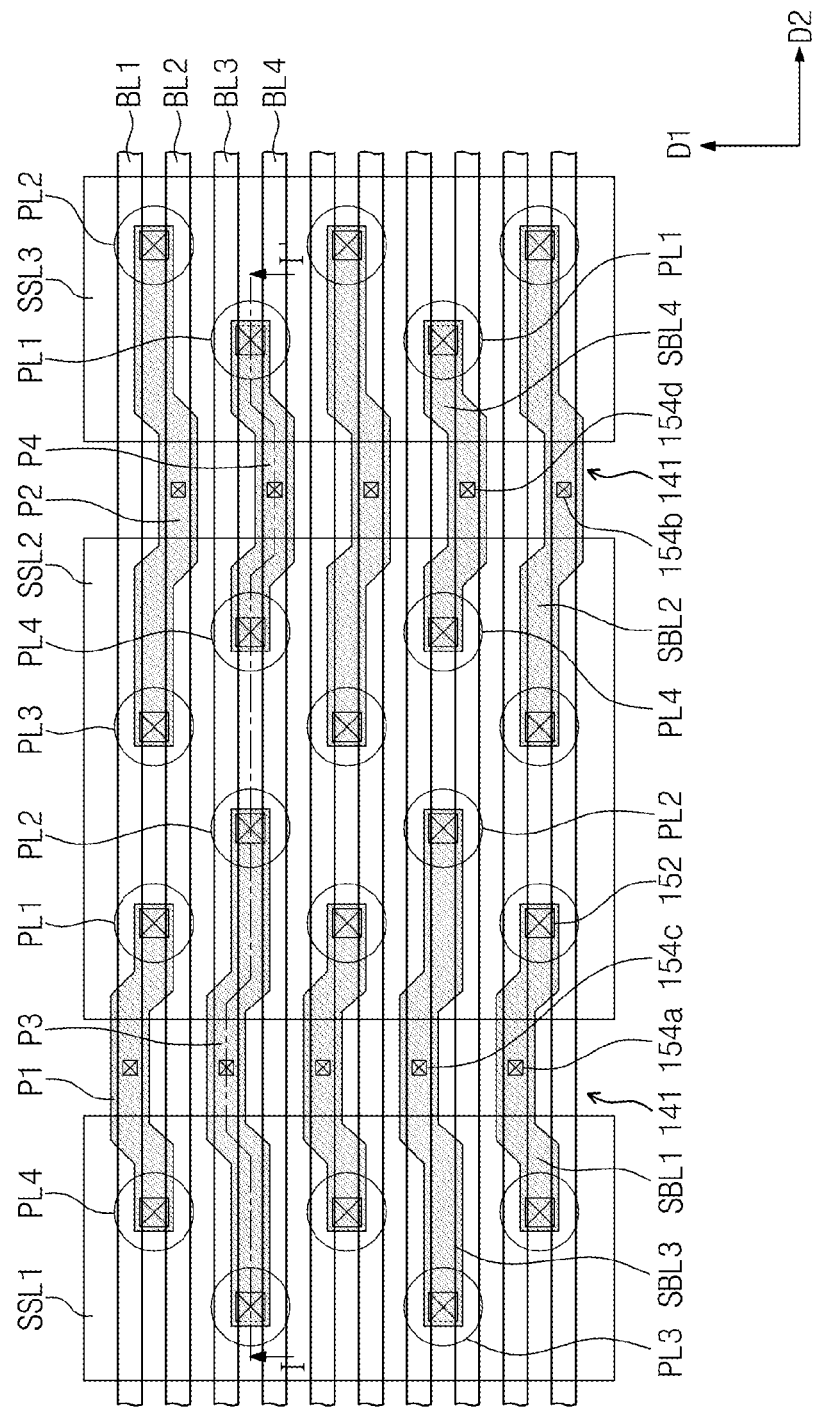
FIG. 13A is a plan view illustrating a vertical-type memory device according to an example of a second embodiment of the inventive concept.
Figure 13B:
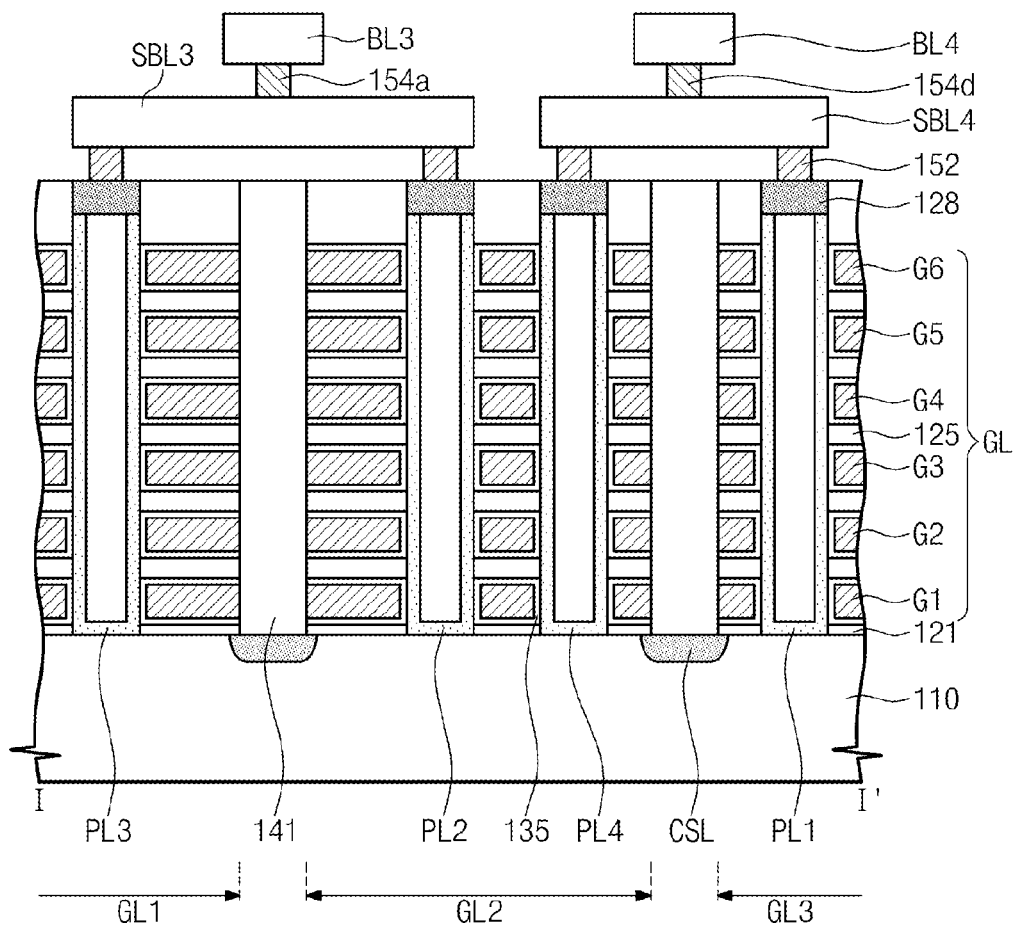
FIG. 13B is a sectional view taken along line I-I' of FIG. 13A.

FIG. 13A is a plan view illustrating a vertical-type memory device according to an example of a second embodiment of the inventive concept, and FIG. 13B is a cross-sectional view taken along line I-I' of FIG. 13A. The elements and features of this example that are identical or similar to those previously shown and described with reference to FIGS. 3, 5A, and 5B may be omitted for a concise description, and differences therebetween will be described with reference to FIGS. 13A and 13B.

Referring to FIGS. 13A and 13B, the gate structures GL may include first, second, and third gate structures GL1, GL2, and GL3 that are sequentially arranged in the enumerated order. Hereinafter, the sixth gate electrode G6 of the first gate structure GL1 will be referred to as a first string selection line SSL1, the sixth gate electrode G6 of the second gate structure GL2 will be referred to as a second string selection line SSL2, and the sixth gate electrode G6 of the third gate structure GL3 will be referred to as a third string selection line SSL3. The first to third string selection lines SSL1-SSL3 may be repeatedly provided in the second direction.

The vertical pillars coupled to each of the string selection lines may include first to fourth vertical pillars PL1-PL4 arranged in a zigzag manner, when viewed in plan view. The first vertical pillars PL1, the second vertical pillars PL2, the third vertical pillars PL3, and the fourth vertical pillars PL4 may be arranged substantially parallel to the first direction D1 to constitute first, second, third, and fourth columns, respectively, and the first, second, third, and fourth columns may be sequentially arranged spaced apart from each other in the second direction, when viewed in plan view. The second vertical pillar PL2 may be shifted from the first vertical pillar PL1 by a first distance in the first direction, and the third vertical pillar PL3 may be shifted from the second vertical pillar PL2 by the first distance in the first direction, and the fourth vertical pillar PL4 may be shifted from the third vertical pillar PL3 by the first distance in the first direction. The first distance may be substantially equivalent to, for example, two times the pitch of the bit lines BL1-BL4. An adjacent pair of the vertical pillars in the first direction D1 may be spaced apart from each other by, for example, four times the pitch of the bit lines BL1-BL4.

The sub-interconnections may include first to fourth sub-interconnections SBL1-SBL4. The first sub-interconnection SBL1 may connect the fourth vertical pillar PL4 coupled with (or passing through) the first string selection line SSL1 to the first vertical pillar PL1 of the second string selection line SSL2. The second sub-interconnection SBL2 may connect the third vertical pillar PL3 coupled with (or passing through) the second string selection line SSL2 to the second vertical pillar PL2 coupled with (or passing through) the third string selection line SSL3. The third sub-interconnection SBL3 may connect the third vertical pillar PL3 coupled with (or passing through) the first string selection line SSL1 to the second vertical pillar PL2 coupled with (or passing through) the second string selection line SSL2. The fourth sub-interconnection SBL4 may connect the fourth vertical pillar PL4 coupled with (or passing through) the second string selection line SSL2 to the first vertical pillar PL1 coupled with (or passing through) the third string selection line SSL3.

The sub-interconnections SBL1-SBL4 may be coupled to the vertical pillars PL1-PL4, respectively, via the lower contacts 152. The lower contacts 152 may be overlapped with the vertical pillars PL1-PL4, respectively, in plan view. The first to fourth sub-interconnections SBL1-SBL4 may extend along the second direction. In certain embodiments, each of the first and third sub-interconnections SBL1 and SBL3 may include first and third protrusions P1 and P3, respectively, protruding toward the first direction, and each of the second and fourth sub-interconnections SBL2 and SBL4 may include second and fourth protrusions P2 and P4, respectively, protruding toward a direction opposite to the first direction. The protrusions P1-P4 may be positioned on the separation insulating layer 141 and between the gate structures.

The first and third sub-interconnections SBL1 and SBL3 may be alternatingly disposed along the first direction, and the second and fourth sub-interconnections SBL2 and SBL4 may be alternatingly disposed along the first direction. The first and second sub-interconnections SBL1 and SBL2 may be alternatingly disposed along the second direction, and the third and fourth sub-interconnections SBL3 and SBL4 may be alternatingly disposed along the second direction. Each of the first to fourth sub-interconnections SBL1-SBL4 may be connected to a corresponding one of four different bit lines that are arranged sequentially. For example, a plurality of first sub-interconnections SBL1 may be connected in common to a corresponding one of the first bit lines BL1, a plurality of second sub-interconnections SBL2 may be connected in common to a corresponding one of the second bit lines BL2, a plurality of third sub-interconnections SBL3 may be connected in common to a corresponding one of the third bit lines BL3, and a plurality of fourth sub-interconnections SBL4 may be connected in common to a corresponding one of the fourth bit lines BL4. The first to fourth bit lines BL1-BL4 may extend parallel to the second direction and be sequentially arranged and spaced apart from each other in the first direction.

The first to fourth bit lines BL1-BL4 may be connected to the first to fourth sub-interconnections SBL1-SBL4, respectively, via upper contacts 154*a*, 154*b*, 154*c*, and 154*d*. The upper contacts 154*a*-154*d* may be provided on the protrusions P1-P4, respectively. For example, the first and third upper contacts 154*a* and 154*c* respectively disposed on the first and third sub-interconnections SBL1 and SBL3 may be shifted from the lower contacts 152, by a distance equal to half the pitch of the bit lines, in the first direction, and the second and fourth upper contacts 154*b* and 154*d* respectively disposed on the second and fourth sub-interconnections SBL2 and SBL4 may be shifted from the lower contacts 152, by a distance equal to half the pitch of the bit lines, in the direction opposite to the first direction.

Figure 14:
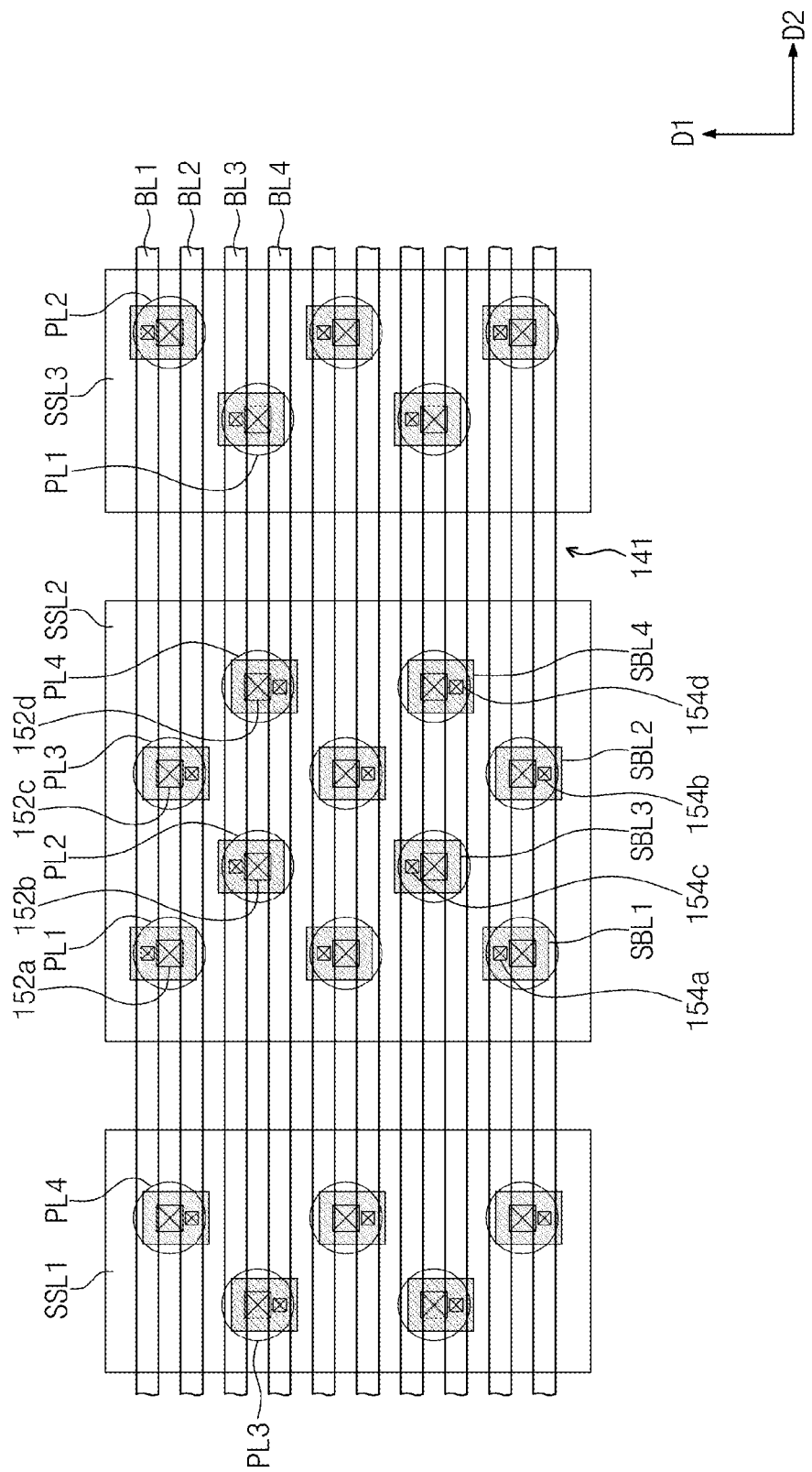
FIG. 14 is a plan view illustrating a vertical-type memory device according to other example of the second embodiment of the inventive concept.

FIG. 14 is a plan view illustrating a vertical-type memory device according to other example of the second embodiment of the inventive concept. The vertical-type memory device of FIG. 14 may have a vertical section identical or similar to FIG. 12B, and thus, a cross-sectional view thereof is omitted. The elements and features of this example that are identical or similar to those previously shown and described with reference to FIGS. 13A and 13B may be omitted for the sake of brevity, and differences therebetween will be mainly described with reference to FIG. 14.

Referring to FIG. 14, the sub-interconnections may include first to fourth sub-interconnections SBL1-SBL4. First sub-interconnections SBL1 may be connected to the first vertical pillars PL1 via first lower contacts 152*a* overlapped with the first vertical pillars PL1. Second sub-interconnections SBL2 may be connected to the third vertical pillars PL3 via third lower contacts 152*c* overlapped with the third vertical pillars PL3. Third sub-interconnections SBL3 may be connected to the second vertical pillars PL2 via second lower contacts 152b overlapped with the second vertical pillars PL2. Fourth sub-interconnections SBL4 may be connected to the fourth vertical pillars PL4 via fourth lower contacts 152d overlapped with the fourth vertical pillars PL4.

A plurality of the first sub-interconnections SBL1 may be arranged along the first direction. A plurality of the second sub-interconnections SBL2 may be arranged along the first direction. A plurality of the third sub-interconnections SBL3 may be arranged along the first direction. A plurality of the fourth sub-interconnections SBL4 may be arranged along the first direction. The first and second sub-interconnections SBL1 and SBL2 may be alternatingly disposed along the second direction. The third and fourth sub-interconnections SBL3 and SBL4 may be alternatingly disposed along the second direction. Each of the first to fourth sub-interconnections SBL1-SBL4 may be connected to a corresponding one of four different bit lines arranged in a sequential manner.

A plurality of the first sub-interconnections SBL1 arranged in the second direction D2 may be connected in common to a corresponding one of the first bit lines BL1 via the first upper contacts 154a offset from the first vertical pillars PL1 in the first direction. A plurality of the second sub-interconnection SBL2 arranged in the second direction D2 may be connected in common to a corresponding one of the second bit line BL2 through the second upper contacts 154b offset from the third vertical pillars PL3 in the direction opposite to the first direction. A plurality of the third sub-interconnection SBL3 arranged in the second direction D2 may be connected in common to a corresponding one of the third bit line BL3 through the third upper contacts 154c offset from the second vertical pillars PL2 in the first direction. A plurality of the fourth sub-interconnection SBL4 arranged in the second direction D2 may be connected in common to a corresponding one of the fourth bit line BL4 through the fourth upper contacts 154d offset from the fourth vertical pillars PL4 in the direction opposite to the first direction.

On each first sub-interconnection SBL1, the first upper contact 154a may be shifted from the first lower contact 152a by, for example, a distance equal to half the pitch of the bit lines BL1-BL4, in the first direction. On each second sub-interconnection SBL2, the second upper contact 154b may be shifted from the third lower contact 152c by, for example, a distance equal to half the pitch of the bit lines BL1-BL4, in the direction opposite to the first direction. On each third sub-interconnection SBL3, the third upper contact 154c may be shifted from the second lower contact 152b by, for example, a distance equal to half the pitch of the bit lines BL1-BL4, in the first direction. On each fourth sub-interconnection SBL4, the fourth upper contact 154d may be shifted from the fourth lower contact 152d by, for example, a distance equal to half the pitch of the bit lines BL1-BL4, in the direction opposite to the first direction.

Figure 15A:
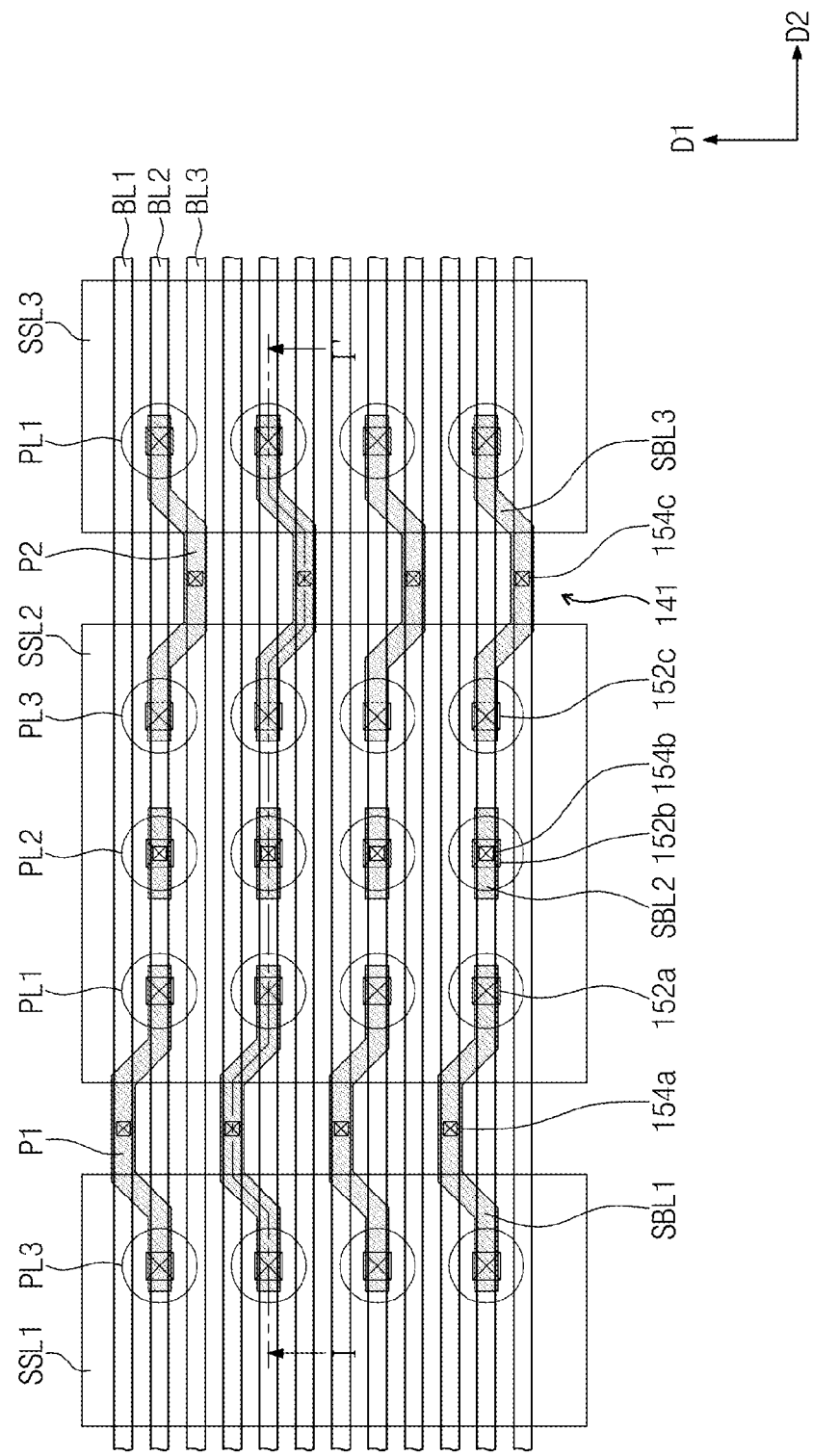
FIG. 15A is a plan view illustrating a vertical-type memory device according to an example of a third embodiment of the inventive concept.
Figure 15B:
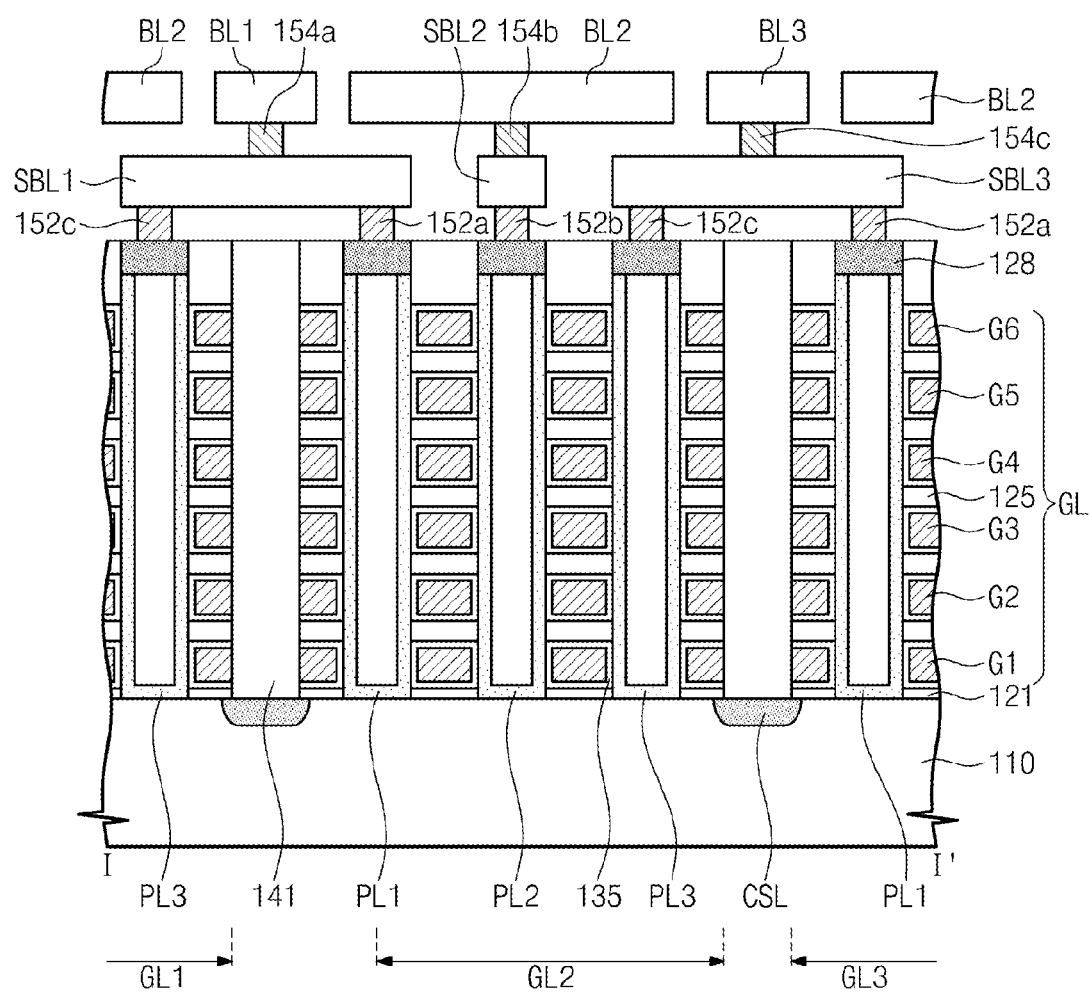
FIG. 15B is a sectional view taken along line I-I' of FIG. 15A.

FIG. 15A is a plan view illustrating a vertical-type memory device according to an example of a third embodiment of the inventive concept, and FIG. 15B is a cross-sectional view taken along line I-I' of FIG. 15A. The elements and features of this example that are identical or similar to those previously shown and described with reference to FIGS. 3, 5A, and 5B may be omitted for the sake of brevity, and differences therebetween will be mainly described with reference to FIGS. 15A and 15B.

Referring to FIGS. 15A and 15B, the gate structures GL may include first to third gate structures GL1-GL3 that are sequentially arranged in the enumerated order. Hereinafter, the sixth gate electrode G6 of the first gate structure GL1 will be referred to as a first string selection line SSL1, the sixth gate electrode G6 of the second gate structure GL2 will be referred to as a second string selection line SSL2, and the sixth gate electrode G6 of the third gate structure GL3 will be referred to as a third string selection line SSL3. The gate structures GL may further include a plurality of string selection line groups, each of which includes the first to third string selection lines SSL1-SSL3, and which are arranged in the second direction. The first to third string selection lines SSL1-SSL3 may be repeatedly provided in the second direction.

The vertical pillars coupled to corresponding ones of the string selection lines may include first, second and third vertical pillars PL1, PL2, and PL3. Here, the first vertical pillars PL1 are arranged substantially parallel to the first direction D1 to constitute a first column, the second vertical pillars PL2 are arranged substantially parallel to the first direction D1 to constitute a second column, and the third vertical pillars are arranged substantially parallel to the first direction D1 to constitute a third column. In other words, the first, second, and third columns may be spaced apart from each other in the second direction D2. In plan view, the first to third vertical pillars PL1-PL3 may be two-dimensionally arranged on each of the string selection lines to form a matrix-shaped arrangement.

The sub-interconnections may include first sub-interconnection SBL1, second sub-interconnection SBL2 and third sub-interconnection SBL3 sequentially arranged in the second direction. For example, the first sub-interconnection SBL1 may connect the third vertical pillar PL3 coupled with (or passing through) the first string selection line SSL1 to the first vertical pillar PL1 coupled with (or passing through) the second string selection line SSL2, and the third sub-interconnection SBL3 may connect the third vertical pillar PL3 coupled with (or passing through) the second string selection line SSL2 to the first vertical pillar PL1 coupled with (or passing through) the third string selection line SSL3. The second sub-interconnection SBL2 may be provided on and overlapped with the second vertical pillar PL2.

The first to third sub-interconnections SBL1-SBL3 may be connected to the first to third vertical pillars PL1-PL3, respectively, via the first to third lower contacts 152a-152c. The lower contacts 152a-152c may be provided on and overlapped with the first to third vertical pillars PL1-PL3, respectively.

Each of the first and third sub-interconnections SBL1 and SBL3 may extend along the second direction. In certain embodiments, each of the first sub-interconnections SBL1 may include a first protrusion P1 protruding toward the first direction, and each of the third sub-interconnection SBL3 may include a second protrusion P2 protruding toward the direction opposite to the first direction. The protrusions P1 and P2 may be positioned on the separation insulating layer 141 and between the gate structures GL1 and GL2 and between the gate structures GL2 and GL3. The second sub-interconnection SBL2 may be provided on the second vertical pillar PL2 to be adjacent to the second vertical pillar PL2.

A plurality of the first sub-interconnections SBL1 may be arranged along the first direction. A plurality of the second sub-interconnections SBL2 may be arranged along the first direction. A plurality of third sub-interconnections SBL3 may be arranged along the first direction. The first to third sub-interconnections SBL1-SBL3 may be repeatedly provided in the second direction. The first, second, and third sub-interconnections SBL1, SBL2, and SBL3 may be connected to respective different ones of the bit lines sequentially arranged in the first direction. For example, a plurality of the first sub-interconnections SBL1 may be connected in common to a corresponding one of the first bit lines BL1, a plurality of the second sub-interconnections SBL2 may be connected in common to a corresponding one of the second bit lines BL2, and a plurality of the third sub-interconnections SBL3 may be connected in common to a corresponding one of the third bit lines BL3.

First to third bit lines BL1-BL3 may extend parallel to the second direction and be arranged, in the order enumerated, spaced apart from each other in the first direction. The first bit line BL1 may be connected to the plurality of the first sub-interconnections SBL1 via the first upper contacts 154a. The second bit line BL2 may be connected to the plurality of the second sub-interconnections SBL2 via the second upper contacts 154b. The third bit line BL3 may be connected to a plurality of the third sub-interconnections SBL3 via the third upper contacts 154c. Each of the first and third upper contacts 154a and 154c may be provided between the gate structures GL1-GL3 and on the separation insulating layer 141. The first upper contacts 154a may be shifted from the first lower contact 152a by, for example, a distance equal to the pitch of the bit lines BL1-BL3, in the first direction, and the third upper contacts 154c may be shifted from the third lower contact 152c by, for example, a distance equal to the pitch of the bit lines BL1-BL3, in the direction opposite to the first direction. The second upper contacts 154b may be provided on and overlapped with the second vertical pillars PL2, respectively.

Figure 16A:
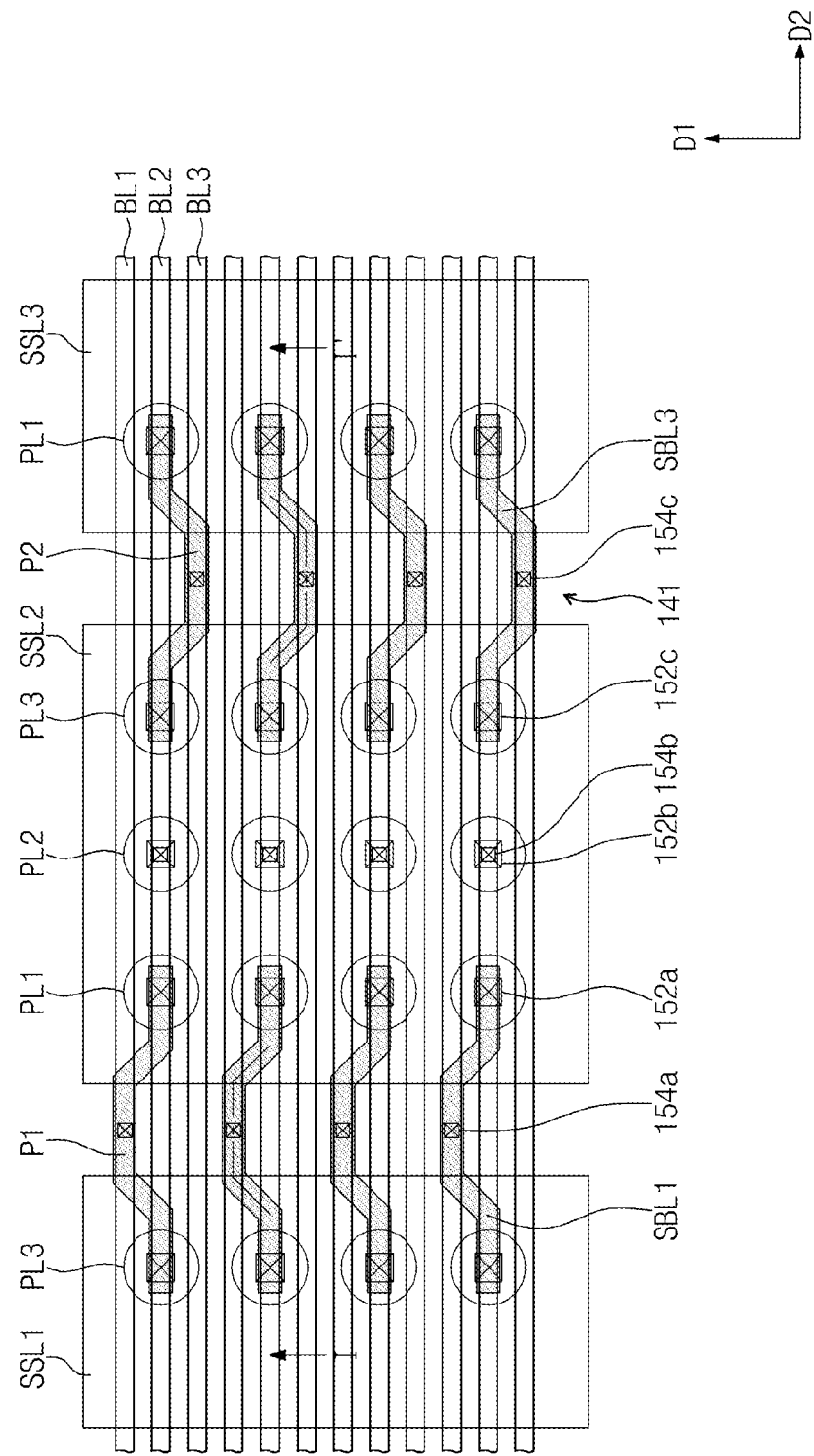
FIG. 16A is a plan view illustrating a vertical-type memory device according to other example of the third embodiment of the inventive concept.
Figure 16B:
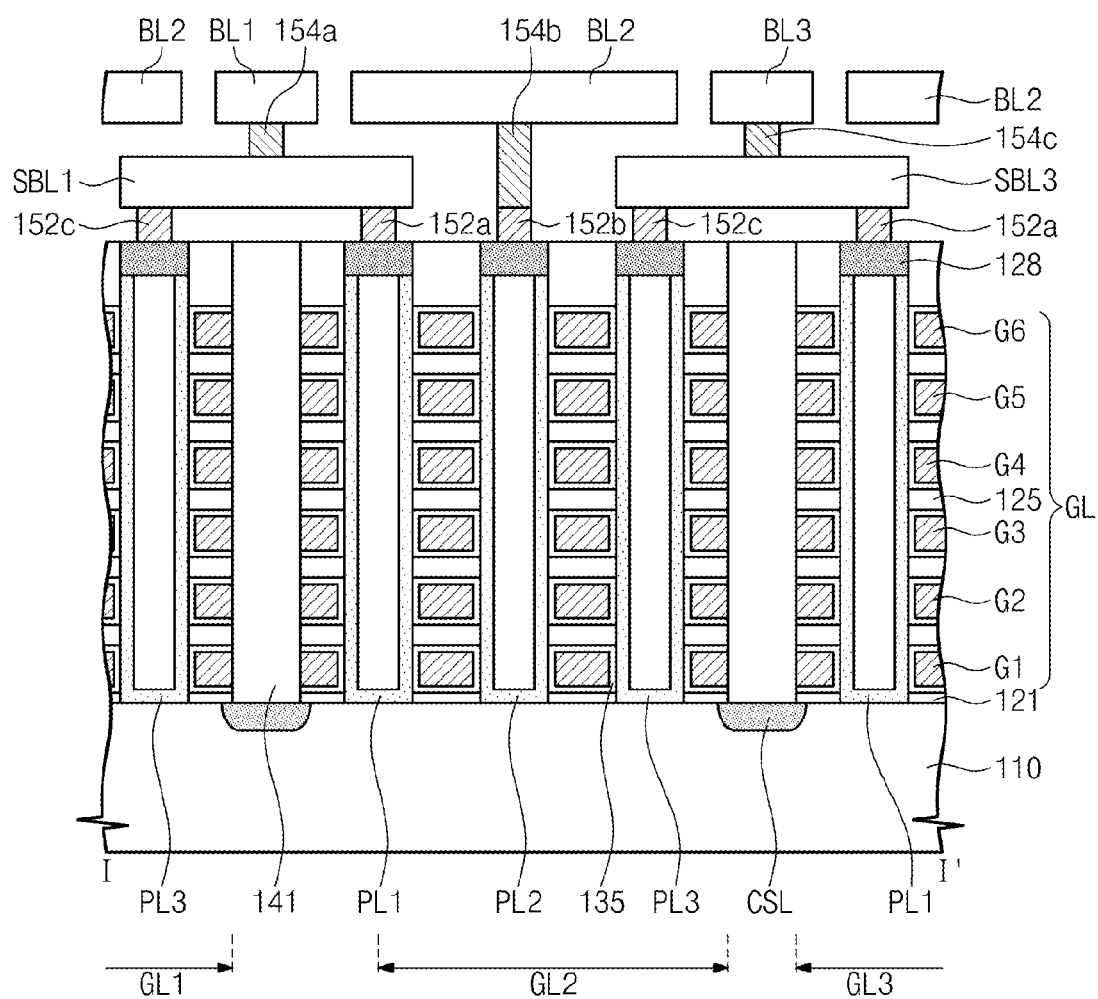
FIG. 16B is a sectional view taken along line I-I' of FIG. 16A.

FIG. 16A is a plan view illustrating a vertical-type memory device according to other example of the third embodiment of the inventive concept, and FIG. 16B is a cross-sectional view taken along line I-I' of FIG. 16A. The elements and features of this example that are identical or similar to those previously shown and described with reference to FIGS. 15A and 15B may be omitted for the sake of brevity, and differences therebetween will be mainly described with reference to FIGS. 16A and 16B.

Referring to FIGS. 16A and 16B, the vertical-type memory device according to the present embodiments may be configured not to have the second sub-interconnections SBL2 described with reference to FIGS. 15A and 15B. The second bit line BL2 may be directly connected to the second vertical pillars PL2 via the second lower contacts 152b and the second upper contacts 154b, without the second sub-interconnections SBL2.

Figure 17:
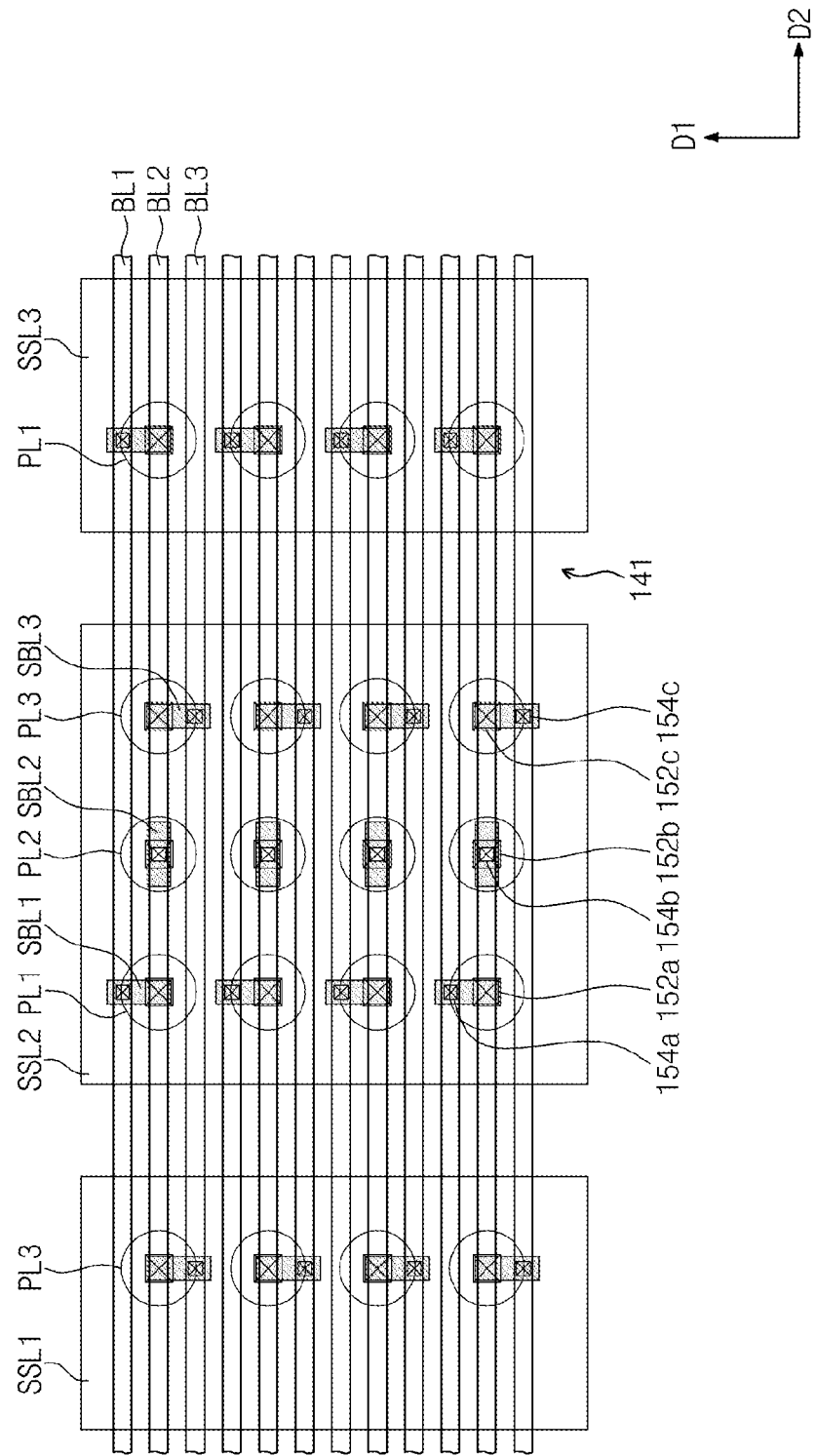
FIG. 17 is a plan view illustrating a vertical-type memory device according to still other example of the third embodiment of the inventive concept.

FIG. 17 is a plan view illustrating a vertical-type memory device according to still other example of the third embodiment of the inventive concept. The vertical-type memory device of FIG. 17 may have a vertical section that is identical or similar to FIG. 12B, and thus, a cross-sectional view thereof is omitted. The elements and features of this example that are identical or similar to those previously shown and described with reference to FIGS. 15A and 15B may be omitted for the sake of brevity, and differences therebetween will be mainly described with reference to FIG. 17.

Referring to FIG. 17, the first bit line BL1 may be connected to the plurality of the first sub-interconnections SBL1 via the first upper contacts 154a, which are offset from the first vertical pillars PL1 by, for example, the pitch of the bit lines, in the first direction. The third bit line BL3 may be connected to the plurality of the third sub-interconnections SBL3 via the third upper contacts 154c, which are offset from the third vertical pillars PL3 by, for example, the pitch of the bit lines, in the direction opposite to the first direction. The second bit line BL2 may be connected to the plurality of second sub-interconnections SBL2 via the second upper contacts 154b overlapped with the second vertical pillars PL2.

Further, as described with reference to FIGS. 16A and 16B, the second sub-interconnections SBL2 described with reference to FIGS. 15A and 15B may not be provided in the vertical-type memory device according to the present embodiments. The second bit line BL2 may be directly connected to the second vertical pillars PL2 via the second lower contacts 152b and the second upper contacts 154b, without the second sub-interconnections SBL2.

Figure 18:
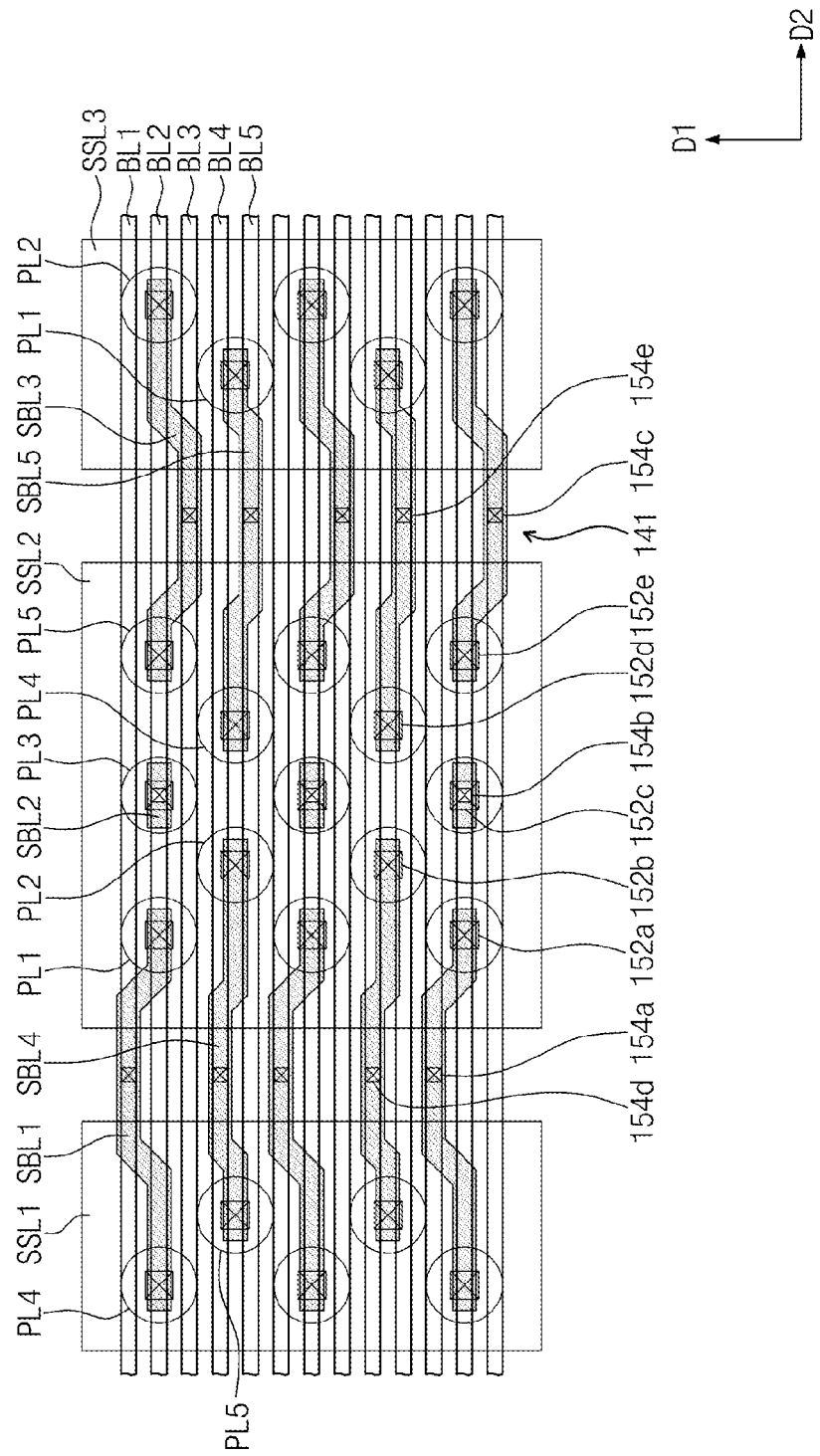
FIG. 18 is a plan view illustrating a vertical-type memory device according to an example of a fourth embodiment of the inventive concept.

FIG. 18 is a plan view illustrating a vertical-type memory device according to an example of a fourth embodiment of the inventive concept. The vertical-type memory device of FIG. 18 may have a vertical section that is identical or similar to FIG. 15B, and thus, a sectional view thereof is omitted. The elements and features of this example that are identical or similar to those previously shown and described with reference to FIGS. 15A and 15B may be omitted for the sake of brevity, and differences therebetween will be mainly described with reference to FIG. 18.

Referring to FIG. 18, in plan view, the vertical pillars coupled to each of the string selection lines may include first to fifth vertical pillars PL1-PL5 arranged in a zigzag manner. In plan view, the first vertical pillars PL1, the second vertical pillars PL2, the third vertical pillars PL3, the fourth vertical pillars PL4, and the fifth vertical pillars PL5 are arranged parallel to the first direction D1 to constitute first, second, third, fourth, and fifth columns, respectively, and the first, second, third, fourth, and fifth columns may be sequentially arranged spaced apart from each other in the second direction. The second vertical pillar PL2 may be shifted from the first vertical pillar PL1 by a first distance in the first direction, the third vertical pillar PL3 may be shifted from the second vertical pillar PL2 by the first distance in the first direction, the fourth vertical pillar PL4 may be shifted from the third vertical pillar PL3 by the first distance in the first direction, and the fifth vertical pillar PL5 may be shifted from the fourth vertical pillar PL4 by the first distance in the first direction. An adjacent pair of vertical pillars in the first direction D1 may be spaced apart from each other by, for example, a distance equal to five times the pitch of each of the bit lines BL1-BL5.

The sub-interconnections may include first to fifth sub-interconnections SBL1-SBL5. The first sub-interconnection SBL1 may connect the fourth vertical pillar PL4 coupled with (or extending through) the first string selection line SSL1 to the first vertical pillar PL1 coupled with (or extending through) the second string selection line SSL2. The second sub-interconnection SBL2 may be provided on or adjacent to the second vertical pillar PL2 and be connected to the second vertical pillar PL2. The third sub-interconnection SBL3 may connect the fifth vertical pillar PL5 coupled with the second string selection line SSL2 to the second vertical pillar PL2 coupled with the third string selection line SSL3. The fourth sub-interconnection SBL4 may connect the fifth vertical pillar PL5 coupled with the first string selection line SSL1 to the second vertical pillar PL2 coupled with the second string selection line SSL2. The fifth sub-interconnection SBL5 may connect the fourth vertical pillar PL4 coupled with the second string selection line SSL2 to the first vertical pillar PL1 coupled with the third string selection line SSL3. The first to fifth sub-interconnections SBL1-SBL5 may be coupled to the first to fifth vertical pillars PL1-PL5, respectively, via the lower contacts 152a, 152b, 152c, 152d, and 152e. The lower contacts 152a, 152b, 152c, 152d, and 152e may be formed on and overlapped with the first to fifth vertical pillars PL1-PL5, respectively.

The first sub-interconnections SBL1 and the fourth sub-interconnections SBL4 may be alternatingly disposed along the first direction, and the third sub-interconnections SBL3 and the fifth sub-interconnections SBL5 may be alternatingly disposed along the first direction. The first, second, and third sub-interconnections SBL1, SBL2, and SBL3 may be repeatedly provided in the second direction, and the fourth and fifth sub-interconnections SBL4 and SBL5 may be repeatedly provided in the second direction. The first to fifth sub-interconnections SBL1-SBL5 may be connected to respective different ones of the bit lines arranged in a sequential manner. For example, a plurality of the first sub-interconnections SBL1 may be connected in common to a corresponding one of the first bit lines BL1, a plurality of the second sub-interconnections SBL2 may be connected in common to a corresponding one of the second bit lines BL2, a plurality of the third sub-interconnections SBL3 may be connected in common to a corresponding one of the third bit lines BL3, a plurality of the fourth sub-interconnections SBL4 may be connected in common to a corresponding one of the fourth bit lines BL4, and a plurality of the fifth sub-interconnections SBL5 may be connected in common to a corresponding one of the fifth bit lines BL5. The first to fifth bit lines BL1-BL5 may extend parallel to the second direction and be arranged, in the order enumerated, spaced apart from each other along the first direction. The first to fifth bit lines BL1-BL5 may be coupled to the first to fifth sub-interconnections SBL1-SBL5, respectively, via the first to fifth upper contacts 154a, 154b, 154c, 154d, and 154e. The first upper contact 154a may be shifted from the first lower contact 152a by, for example, a distance equal to the pitch of the bit lines BL1-BL5 in the first direction. The second upper contact 154b may be provided on the third vertical pillar PL3. The third upper contact 154c may be shifted from the fifth lower contact 152e by, for example, a distance equal to the pith of the bit lines BL1-BL5 in the direction opposite to the first direction. The fourth upper contact 154d may be shifted from the second lower contact 152b by, for example, a distance equal to the pitch of the bit lines BL1-BL5 in the first direction. The fifth upper contact 154e may be shifted from the fourth lower contact 152d by, for example, a distance equal to the pith of the bit lines BL1-BL5 in the direction opposite to the first direction.

Figure 19:
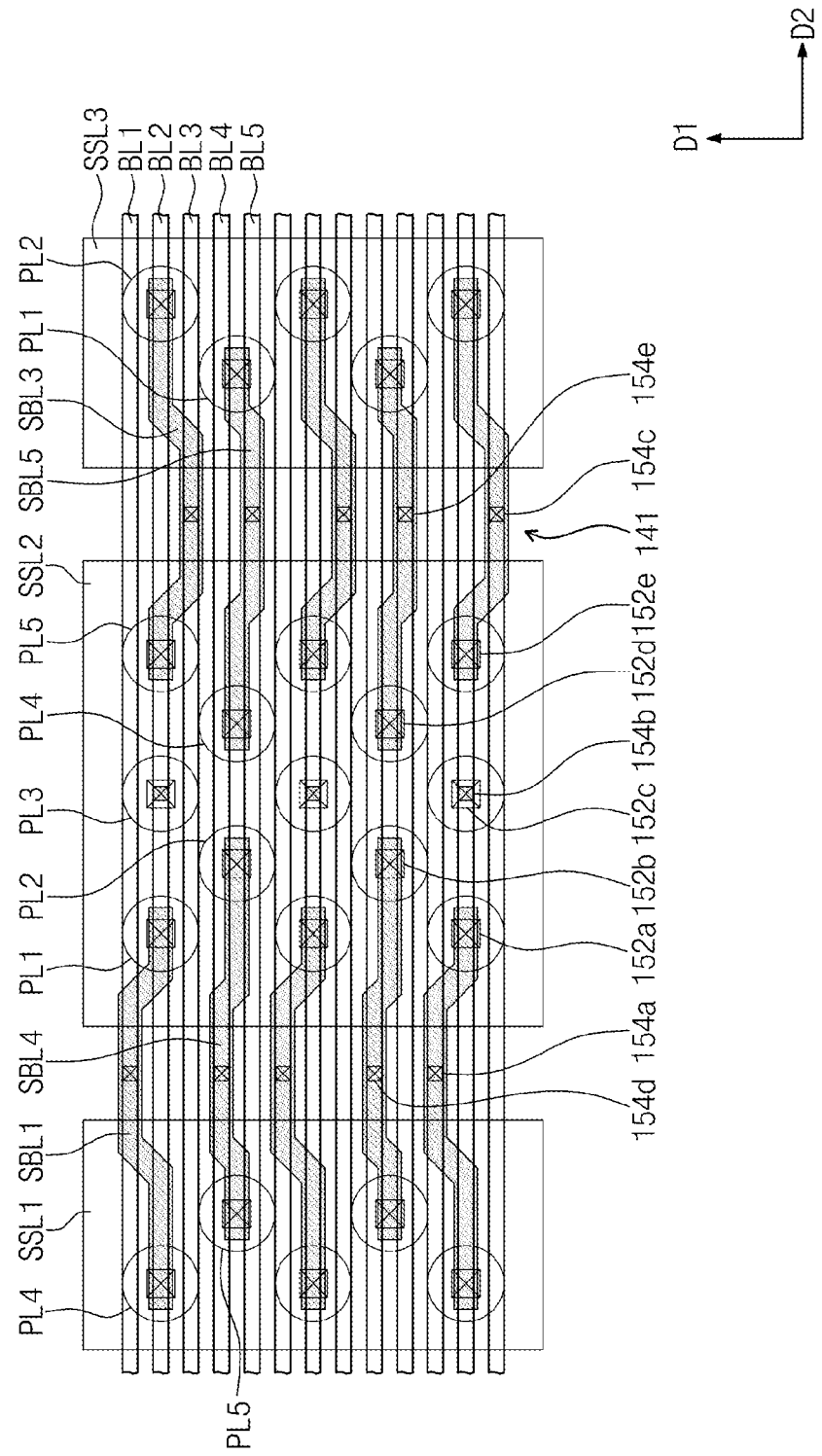
FIG. 19 is a plan view illustrating a vertical-type memory device according to other example of the fourth embodiment of the inventive concept.

FIG. 19 is a plan view illustrating a vertical-type memory device according to other example of the fourth embodiment of the inventive concept. The vertical-type memory device of FIG. 19 may have a vertical section that is identical or similar to FIG. 16B, and thus, a sectional view thereof is omitted. The elements and features of this example that are identical or similar to those previously shown and described with reference to FIG. 18 may be omitted for a concise description, and differences therebetween will be mainly described with reference to FIG. 19.

Referring to FIG. 19, the vertical-type memory device according to the present embodiments may be configured not to have the second sub-interconnections SBL2 described with reference to FIGS. 15A and 15B. The second bit line BL2 may be connected to the third vertical pillars PL3 via the third lower contacts 152c and the second upper contacts 154b, without the second sub-interconnections SBL2.

Figure 20:
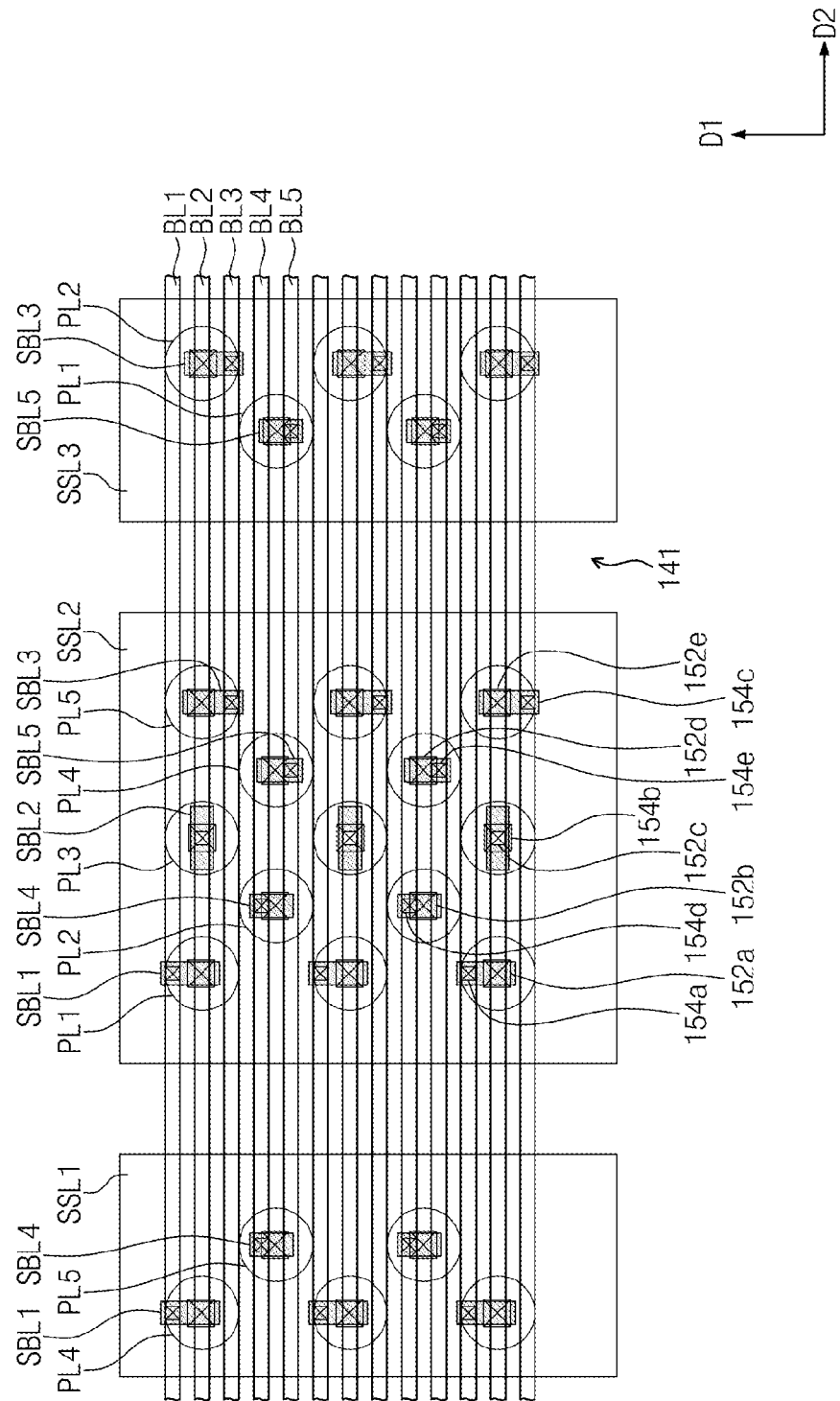
FIG. 20 is a plan view illustrating a vertical-type memory device according to still other example of the fourth embodiment of the inventive concept.

FIG. 20 is a plan view illustrating a vertical-type memory device according to still other example of the fourth embodiment of the inventive concept. The vertical-type memory device of FIG. 20 may have a vertical section that is identical or similar to FIG. 12B, and thus, a cross-sectional view thereof is omitted. The elements and features of this example that are identical or similar to those previously shown and described with reference to FIG. 18 may be omitted for a concise description, and differences therebetween will be mainly described with reference to FIG. 20.

Referring to FIG. 20, the first sub-interconnection SBL1 may be disposed on and be connected to the fourth vertical pillar PL4 coupled with (or extending through) the first string selection line SSL1 and the first vertical pillar PL1 coupled with (or extending through) the second string selection line SSL2. The second sub-interconnection SBL2 may be disposed on and be connected to the third vertical pillar PL3. The third sub-interconnection SBL3 may be disposed on and be connected to the fifth vertical pillar PL5 coupled with the second string selection line SSL2 and the second vertical pillar PL2 coupled with the third string selection line SSL3. The fourth sub-interconnection SBL4 may be disposed on and be connected to the fifth vertical pillar PL5 coupled with the first string selection line SSL1 and the second vertical pillar PL2 coupled with the second string selection line SSL2. The fifth sub-interconnection SBL5 may be disposed on and be connected to the fourth vertical pillar PL4 coupled with the second string selection line SSL2 and the first vertical pillar PL1 coupled with the third string selection line SSL3. The first bit line BL1 may be connected to a plurality of the first sub-interconnections SBL1. The second bit line BL2 may be connected to the plurality of the second sub-interconnections SBL2. The third bit line BL3 may be connected to the plurality of the third sub-interconnections SBL3. The fourth bit line BL4 may be connected to the plurality of the fourth sub-interconnections SBL4. The fifth bit line BL5 may be connected to the plurality of the fifth sub-interconnections SBL5.

Further, as described with reference to FIG. 19, the vertical-type memory device according to the present embodiments may be configured not to have the second sub-interconnections SBL2 described with reference to FIGS. 15A and 15B. The second bit line BL2 may be directly connected to the second vertical pillars PL2 via the third lower contacts 152c and the second upper contacts 154b, without the second sub-interconnections SBL2.

In one aspect, a long axis of the first sub-interconnection SBL1 is substantially perpendicular to a long axis of the second sub-interconnection SBL2.

Figure 21:
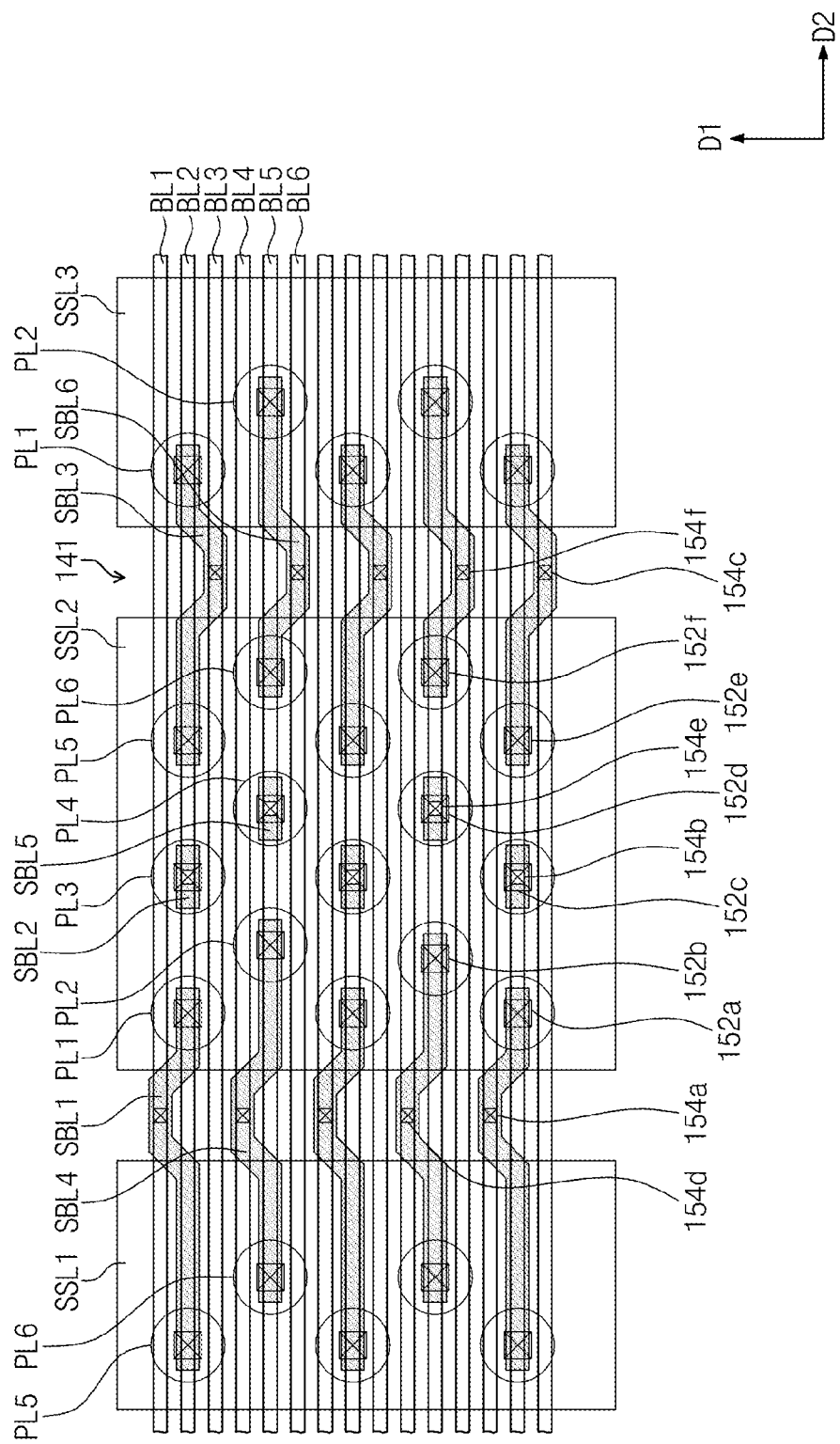
FIG. 21 is a plan view illustrating a vertical-type memory device according to an example of a fifth embodiment of the inventive concept.

FIG. 21 is a plan view illustrating a vertical-type memory device according to an example of a fifth embodiment of the inventive concept. The vertical-type memory device of FIG. 21 may have a vertical section that is identical or similar to FIG. 15B, and thus, a cross-sectional view thereof is omitted. The elements and features of this example that are identical or similar to those previously shown and described with reference to FIG. 18 may be omitted for the sake of brevity, and differences therebetween will be mainly described with reference to FIG. 21.

Referring to FIG. 21, the vertical pillars coupled to each of the selection lines may include first to sixth vertical pillars PL1-PL6 arranged in a zigzag manner, when viewed in plan view. In plan view, the first vertical pillars PL1, the second vertical pillars PL2, the third vertical pillars PL3, the fourth vertical pillars PL4, the fifth vertical pillars PL5, and the sixth vertical pillars PL6 are arranged parallel to the first direction D1 to constitute first, second, third, fourth, fifth, and sixth columns, respectively, and the first, second, third, fourth, fifth, and sixth columns may be sequentially arranged spaced apart from each other in the second direction. The second vertical pillar PL2 may be shifted from the first vertical pillar PL1 by a first distance in the first direction, the third vertical pillar PL3 may be shifted from the second vertical pillar PL2 by the first distance in the first direction, the fourth vertical pillar PL4 may be shifted from the third vertical pillar PL3 by the first distance in the first direction, the fifth vertical pillar PL5 may be shifted from the fourth vertical pillar PL4 by the first distance in the first direction, and the sixth vertical pillar PL6 may be shifted from the fifth vertical pillar PL5 by the first distance in the first direction. An adjacent pair of the vertical pillars in the first direction D1 may be spaced apart from each other by, for example, six times the pitch of each of the bit lines BL1-BL6.

The sub-interconnections may include first to sixth sub-interconnections SBL1-SBL6. The first sub-interconnection SBL1 may connect the fifth vertical pillar PL5 of the first string selection line SSL1 to the first vertical pillar PL1 of the second string selection line SSL2. The second sub-interconnection SBL2 may be provided on and adjacent to the third vertical pillar PL3 and be connected to the third vertical pillar PL3. The third sub-interconnection SBL3 may connect the fifth vertical pillar PL5 of the second string selection line SSL2 to the first vertical pillar PL1 of the third string selection line SSL3. The fourth sub-interconnection SBL4 may connect the sixth vertical pillar PL6 of the first string selection line SSL1 to the second vertical pillar PL2 of the second string selection line SSL2. The fifth sub-interconnection SBL5 may be provided on and adjacent to the fourth vertical pillar PL4 and be connected to the fourth vertical pillar PL4. The sixth sub-interconnection SBL6 may connect the sixth vertical pillar PL6 of the second string selection line SSL2 to the second vertical pillar PL2 of the third string selection line SSL3. The first to sixth sub-interconnections SBL1-SBL6 may be coupled to the first to sixth vertical pillars PL1-PL6, respectively, via lower contacts 152a, 152b, 152c, 152d, 152e, and 152f. The lower contacts 152a, 152b, 152c, 152d, 152e, and 152f may be disposed on and overlapped with the vertical pillars PL1-PL6, respectively.

The first sub-interconnections SBL1 and the fourth sub-interconnections SBL4 may be alternatingly disposed along the first direction, and the third sub-interconnections SBL3 and the sixth sub-interconnections SBL6 may be alternatingly disposed along the first direction. The first, second, and third sub-interconnections SBL1, SBL2, and SBL3 may be repeatedly provided in the second direction, and the fourth, fifth, and sixth sub-interconnections SBL4, SBL5, and SBL6 may be repeatedly provided in the second direction. The first to sixth sub-interconnections SBL1-SBL6 may be connected to respective different ones of the bit lines arranged in a sequential manner. For example, a plurality of the first sub-interconnections SBL1 may be connected in common to a corresponding one of the first bit lines BL1, a plurality of the second sub-interconnections SBL2 may be connected in common to a corresponding one of the second bit lines BL2, a plurality of the third sub-interconnections SBL3 may be connected in common to a corresponding one of the third bit lines BL3, a plurality of the fourth sub-interconnections SBL4 may be connected in common to a corresponding one of the fourth bit lines BL4, a plurality of the fifth sub-interconnections SBL5 may be connected in common to a corresponding one of the fifth bit lines BL5, and a plurality of the sixth sub-interconnections SBL6 may be connected in common to a corresponding one of the sixth bit lines BL6. The first to sixth bit lines BL1-BL6 may extend parallel to the second direction and be arranged, in the order enumerated, spaced apart from each other along the first direction. The first upper contact 154a may be shifted from the first lower contact 152a by, for example, a distance equal to the pitch of the bit lines BL1-BL6 in the first direction. The second upper contact 154b may be provided on the third vertical pillar PL3. The third upper contact 154c may be shifted from the fifth lower contact 152e by, for example, a distance equal to the pitch of the bit lines BL1-BL6 in the direction opposite to the first direction. The fourth upper contact 154d may be shifted from the second lower contact 152b by, for example, a distance equal to the pitch of the bit lines BL1-BL6 in the first direction. The fifth upper contact 154e may be provided on the fourth vertical pillar PL4. The sixth upper contact 154f may be shifted from the sixth lower contact 152f by, for example, a distance equal to the pitch of the bit lines BL1-BL6 in the direction opposite to the first direction. The first to sixth bit lines BL1-BL6 may be coupled to the first to sixth sub-interconnections SBL1-SBL6, respectively, via the first to sixth upper contacts 154a, 154b, 154c, 154d, 154e, and 154f.

Figure 22:
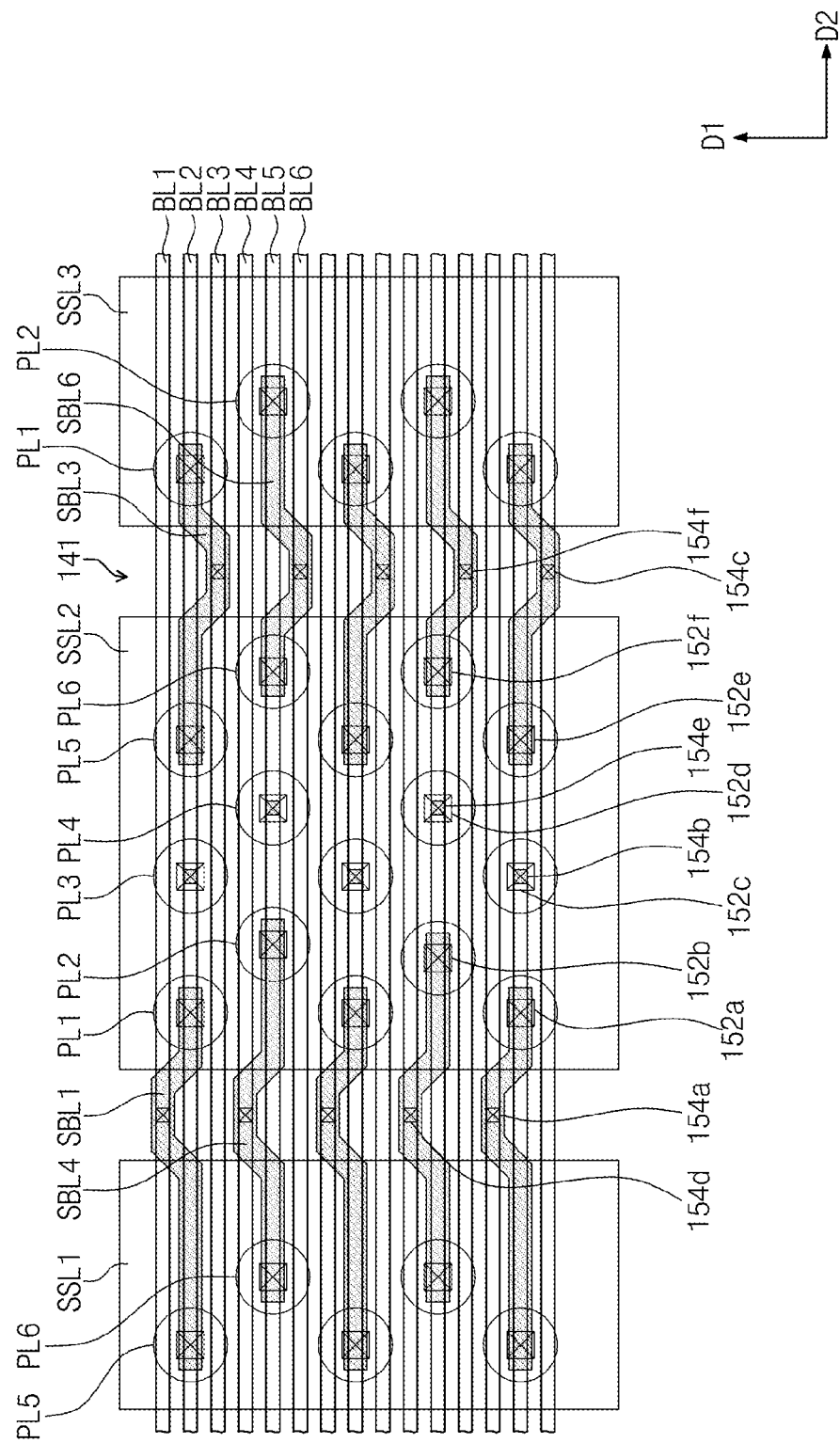
FIG. 22 is a plan view illustrating a vertical-type memory device according to other example of the fifth embodiment of the inventive concept.

FIG. 22 is a plan view illustrating a vertical-type memory device according to other example of the fifth embodiment of the inventive concept. The vertical-type memory device of FIG. 22 may have a vertical section that is identical or similar to FIG. 16B, and thus, a sectional view thereof is omitted. The elements and features of this example that are identical or similar to those previously shown and described with reference to FIG. 21 may be omitted for a concise description, and differences therebetween will be mainly described with reference to FIG. 22.

Referring to FIG. 22, the vertical-type memory device according to the present embodiments may be configured not to include the second and fifth sub-interconnections SBL2 and SBL5 of FIG. 21. The second bit line BL2 may be directly connected to the third vertical pillars PL3 via the third lower contacts 152c and the second upper contacts 154b, without the second sub-interconnection SBL2. The fifth bit line BL5 may be directly connected to the fourth vertical pillars PL4 via the fourth lower contacts 152d and the fifth upper contacts 154e, without the fifth sub-interconnection SBL5.

Figure 23:
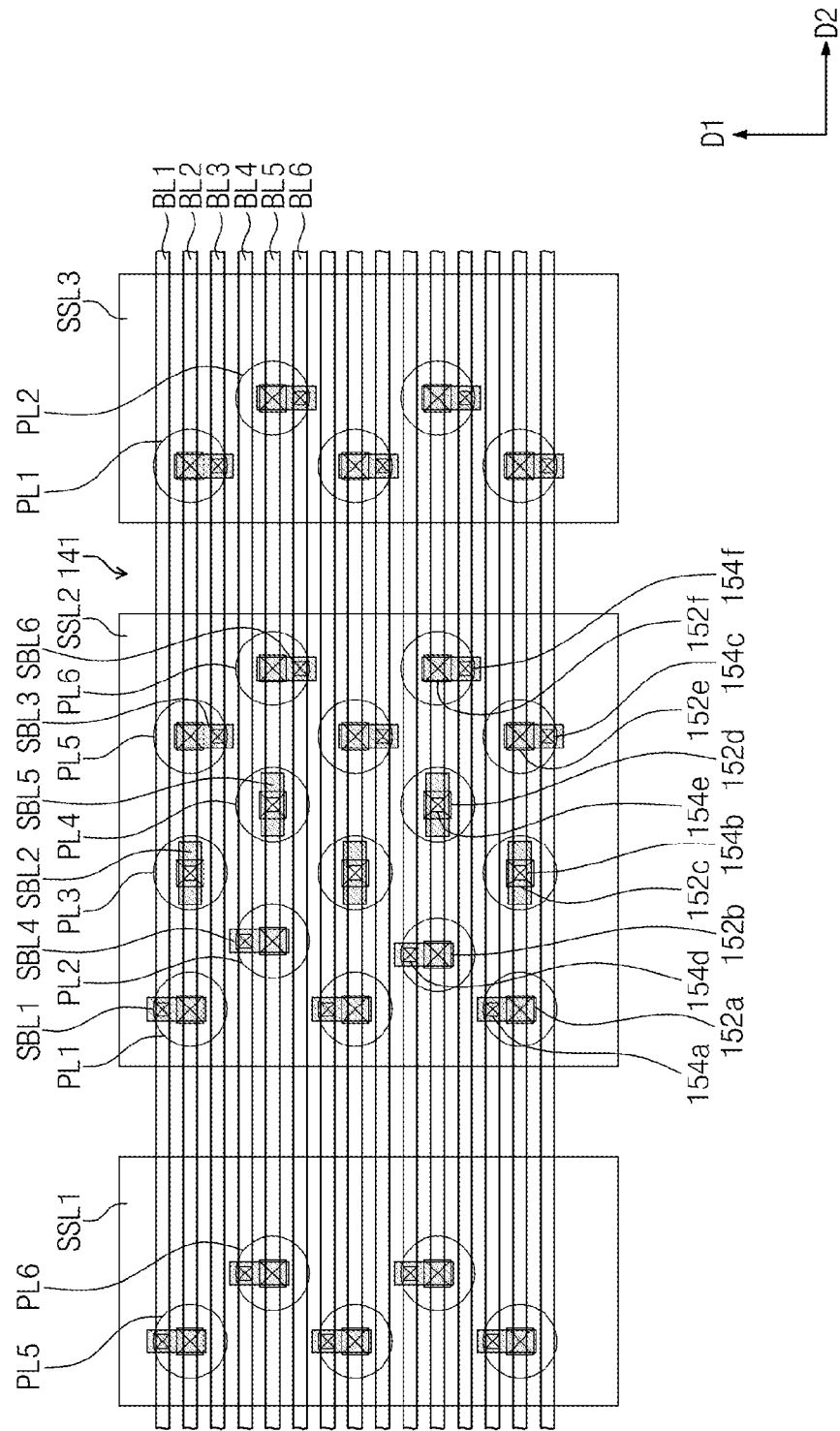
FIG. 23 is a plan view illustrating a vertical-type memory device according to still other example of the fifth embodiment of the inventive concept.

FIG. 23 is a plan view illustrating a vertical-type memory device according to still other example of the fifth embodiment of the inventive concept. The vertical-type memory device of FIG. 23 may have a vertical section that is identical or similar to FIG. 12B, and thus, a sectional view thereof is omitted. The elements and features of this example that are identical or similar to those previously shown and described with reference to FIG. 21 may be omitted for a concise description, and differences therebetween will be mainly described with reference to FIG. 23.

Referring to FIG. 23, the first sub-interconnection SBL1 may be provided on or adjacent to the first vertical pillar PL1 and be connected to the first vertical pillar PL1. The second sub-interconnection SBL2 may be provided on or adjacent to the second vertical pillar PL2 and be connected to the second vertical pillar PL2. The third sub-interconnection SBL3 may be provided on or adjacent to the third vertical pillar PL3 and be connected to the third vertical pillar PL3. The fourth sub-interconnection SBL4 may be provided on or adjacent to the fourth vertical pillar PL4 and be connected to the fourth vertical pillar PL4. The fifth sub-interconnection SBL5 may be provided on or adjacent to the fifth vertical pillar PL5 and be connected to the fifth vertical pillar PL5. The first bit line BL1 may be connected to the plurality of the first sub-interconnections SBL1. The second bit line BL2 may be connected to the plurality of second sub-interconnections SBL2. The third bit line BL3 may be connected to the plurality of the third sub-interconnections SBL3. The fourth bit line BL4 may be connected to the plurality of the fourth sub-interconnections SBL4. The fifth bit line BL5 may be connected to the plurality of fifth sub-interconnections SBL5. The sixth bit line BL6 may be connected to the plurality of the sixth sub-interconnections SBL6.

Furthermore, as described with reference to FIG. 22, the vertical-type memory device according to the present embodiments may be configured not to include the second and fifth sub-interconnections SBL2 and SBL5. The second bit line BL2 may be directly connected to the third vertical pillars PL3 via the third lower contacts 152c and the second upper contacts 154b, without the second sub-interconnection SBL2. The fifth bit line BL5 may be directly connected to the fourth vertical pillars PL4 via the fourth lower contacts 152*d* and the fifth upper contacts 154*e*, without the fifth sub-interconnection SBL5.

According to example embodiments of the inventive concept, the sub-interconnections may be used to connect the vertical pillars to the bit lines, and such a use of the sub-interconnections makes it possible to reduce the space between the bit lines. Further, it is possible to double the number (i.e., page size or depth) of bit lines selected by one string selection gate, compared with the conventional V-NAND structure. Accordingly, it is possible to increase the read/write speed of the vertical-type memory device.

For example, in the vertical-type memory device, an effective channel area may be given by a mean area occupied by each channel, when viewed in plan view. The effective channel area may be given by (2 F×5 F) per two channels (i.e., 5 $F^2$) for the case of FIG. 5A and by (2 F×3 F) per each channel (i.e., 6 $F^2$) for the case of the conventional V-NAND structure, where F denotes a diameter of each vertical pillar. In other words, according to example embodiments of the inventive concept, it is possible to reduce a unit cell area and thereby increase integration density of the vertical-type memory device.

Figure 24:
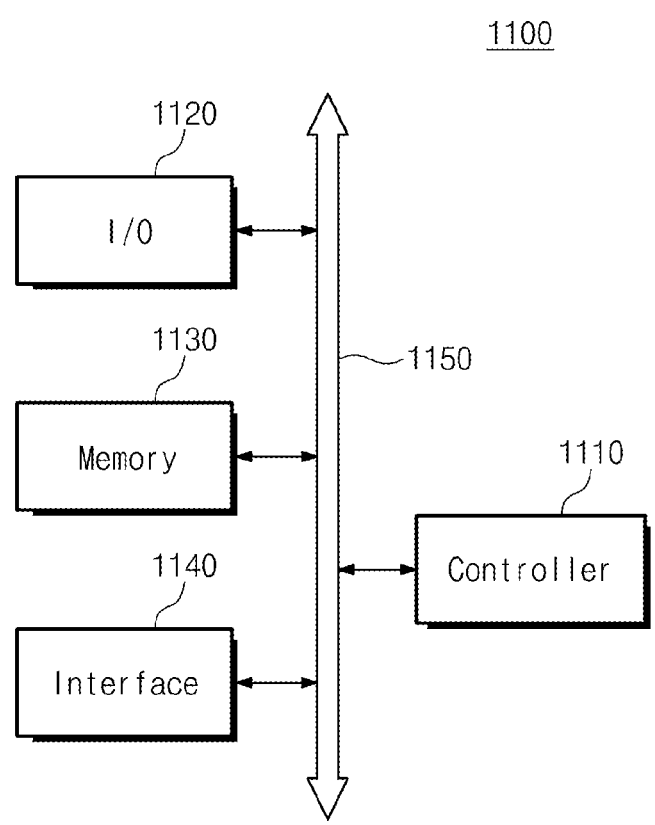
FIG. 24 is a schematic block diagram illustrating an example of electronic systems including a semiconductor device according to example embodiments of the inventive concept.

FIG. 24 is a schematic block diagram illustrating an example of electronic systems including a semiconductor device according to example embodiments of the inventive concept.

Referring to FIG. 24, an electronic system 1100 according to example embodiments of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other via the data bus 1150. The data bus 1150 may correspond to a path through which electrical signals are transmitted. The memory device 1130 may be configured to include one of semiconductor devices according to example embodiments of the inventive concept.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. The electronic system 1100 may further include a fast DRAM device and/or a fast SRAM device that acts as a cache memory for improving an operation of the controller 1110.

The electronic system 1100 may be applied to a personal digital assistant (PDA), a portable computer, a web tablet, a wireless phone, a mobile phone, a digital music player, a memory card or an electronic product. The electronic product may receive or transmit information data wirelessly.

Figure 25:
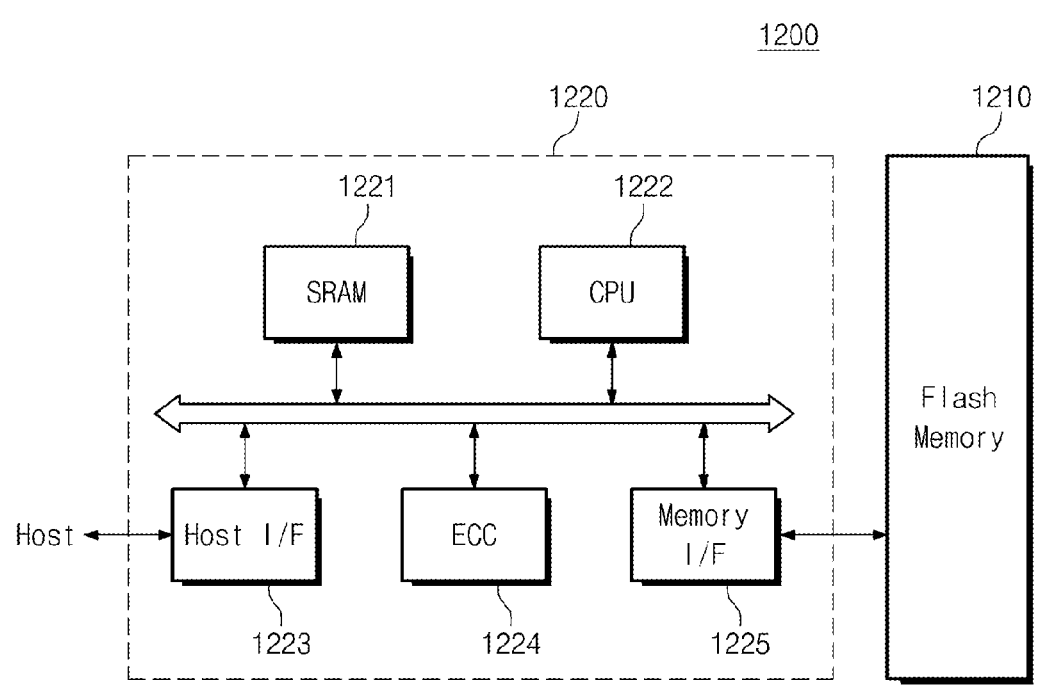
FIG. 25 is a schematic block diagram illustrating an example of memory systems including the semiconductor devices according to example embodiments of the inventive concept.

FIG. 25 is a schematic block diagram illustrating an example of memory systems including the semiconductor devices according to the embodiments of the inventive concept.

Referring to FIG. 25, a memory system 1200 according to example embodiments of the inventive concept may include a memory device 1210. The memory device 1210 may include at least one of the semiconductor memory devices according to the afore-described embodiments of the inventive concept. In other embodiments, the memory device 1210 may further include a semiconductor memory device, which is of a different type from the semiconductor memory devices according to the afore-described embodiments of the inventive concept. For example, the memory device 1210 may further include a nonvolatile memory device and/or a static random access memory (SRAM) device. The memory system 1200 may include a memory controller 1220 that controls data communication between a host and the memory device 1210. The memory device 1210 and/or the memory controller 1220 may be configured to include at least one of the semiconductor devices according to example embodiments of the inventive concept.

The memory controller 1220 may include a processing unit 1222 that controls overall operations of the memory system 1200. In addition, the memory controller 1220 may include an SRAM device 1221 used as an operation memory of the processing unit 1222. Moreover, the memory controller 1220 may further include a host interface unit 1223 and a memory interface unit 1225. The host interface unit 1223 may be configured to include a data communication protocol between the memory system 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. The memory system 1200 may further include a read only memory (ROM) device that stores code data to interface with the host. The memory system 1200 may be used as a portable data storage card. Alternatively, the memory system 1200 may be provided in the form of solid state disks (SSD), instead of hard disks of computer systems.

Figure 26:
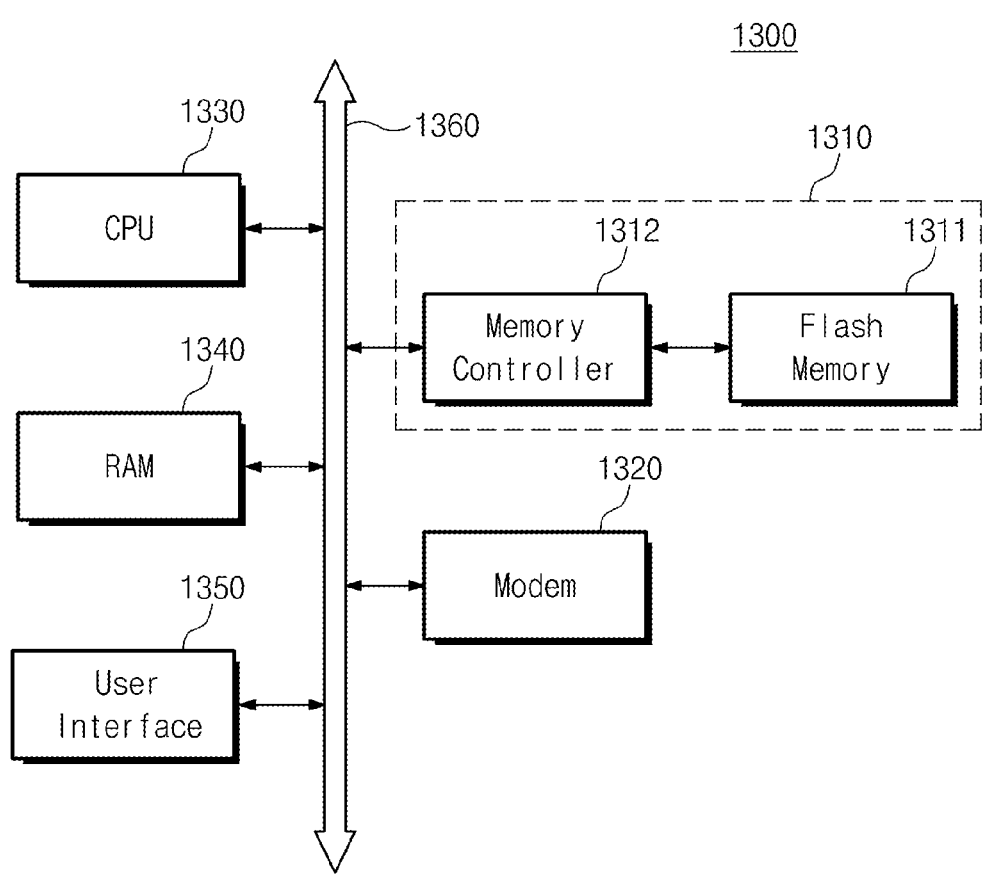
FIG. 26 is a schematic block diagram illustrating an example of information processing systems including a semiconductor device according to example embodiments of the inventive concept.

FIG. 26 is a schematic block diagram illustrating an example of information processing systems including a semiconductor device according to example embodiments of the inventive concept.

Referring to FIG. 26, an information processing system 1300 includes a memory system 1310, which may include at least one of the semiconductor devices according to example embodiments of the inventive concept. In certain embodiments, the information processing system 1300 may be used to realize a mobile device or a desktop computer. The information processing system 1300 also includes a modem 1320, a central processing unit (CPU) 1330, a RAM 1340, and a user interface 1350, which may be electrically connected to the memory system 1310 via a system bus 1360. The memory system 1310 may have the same configuration as that of the memory system 1200 described above. The memory system 1310 may include a memory device 1311 and a memory controller 1312 controlling an overall operation of the memory device 1311. Data processed by the CPU 1330 and/or input from the outside may be stored in the memory system 1310. Here, the memory system 1310 may be provided as a solid state drive SSD, and thus, the information processing system 1300 may be able to store reliably a large amount of data in the memory system 1310. This increase in reliability enables the memory system 1310 to conserve resources for error correction and realize a high speed data exchange function. Although not shown in the drawing, it will be apparent to those of ordinary skill in the art that the information processing system 1300 may be also configured to include an application chipset, a camera image processor (CIS), and/or an input/output device.

According to example embodiments of the inventive concept, a vertical-type memory device can be configured to have a reduced unit cell area and thereby to have an increased integration density. Further, the vertical-type memory device can have an increased page size or depth and consequently have an improved read/write speed, compared with the conventional structure.

While example embodiments of the inventive concepts have been particularly shown and described, it will be understood by one of ordinary skill in the art that variations in form and detail may be made therein without departing from the spirit and scope of the attached claims.

What is claimed is:

1. A memory device, comprising:
   a plurality of selection lines extending in a first direction and spaced apart from each other in a second direction, the second direction crossing the first direction, the selection lines comprising first to third selection lines sequentially arranged in the second direction;
   a plurality of vertical pillars, each coupled to a corresponding one of the selection lines;
   a sub-interconnection extending over adjacent ones of the selection lines; and
   a bit line connected to the sub-interconnection and extending in the second direction,
   wherein the vertical pillars are arranged in a zigzag manner and include first to fifth vertical pillars constituting first to fifth columns, respectively, which are sequentially arranged in the second direction.

2. The memory device of claim 1, wherein the second vertical pillar is shifted from the first vertical pillar by a first distance in the first direction, the third vertical pillar is shifted from the second vertical pillar by the first distance in the first direction, the fourth vertical pillar is shifted from the third vertical pillar by the first distance in the first direction, and the fifth vertical pillar is shifted from the fourth vertical pillar by the first distance in the first direction.

3. The memory device of claim 2, wherein the first vertical pillar coupled with the second selection line is shifted from the first vertical pillar coupled with the first selection line by the first distance in the first direction.

4. The memory device of claim 3, wherein the sub-interconnection comprises:
   a first sub-interconnection connecting the fourth vertical pillar coupled with the first selection line to the first vertical pillar coupled with the second selection line;
   a second sub-interconnection connecting the fifth vertical pillar coupled with the second selection line to the second vertical pillar coupled with the third selection line;
   a third sub-interconnection connecting the fifth vertical pillar coupled with the first selection line to the second vertical pillar coupled with the second selection line; and
   a fourth sub-interconnection connecting the fourth vertical pillar coupled with the second selection line to the first vertical pillar coupled with the third selection line.

5. The memory device of claim 4, further comprising a fifth sub-interconnection connected to the third vertical pillar coupled with each of the selection lines.

6. The memory device of claim 5, wherein the bit line comprises first to fifth bit lines sequentially arranged in the first direction, and
   the first to fifth sub-interconnections are each connected to a respective different one of the bit lines.

7. The memory device of claim 6, wherein the sub-interconnections are connected to the vertical pillars via lower contacts provided on the vertical pillars, and
   the bit lines are connected to the sub-interconnections via upper contacts provided on the sub-interconnections.

8. The memory device of claim 4, wherein the bit line comprises first to fifth bit lines sequentially arranged in the first direction,
   the first to fourth sub-interconnections are connected to the first, second, fourth and fifth vertical pillars via first lower contacts, each of which is provided on a corresponding one of the first, second, fourth and fifth vertical pillars,
   four of the bit lines are connected to the first to fourth sub-interconnections, respectively, via first upper contacts, each of which is provided on a corresponding one of the first to fourth sub-interconnections, and
   the remaining one of the bit lines is connected to the third vertical pillar via a second lower contact and a second upper contact, which are provided on the third vertical pillar.

9. The memory device of claim 2, wherein the vertical pillars coupled to each of the selection lines further comprise sixth vertical pillars constituting a sixth column arranged next to the fifth column, and wherein each of the sixth vertical pillars is shifted from a corresponding one of the fifth vertical pillars by the first distance in the first direction.

10. The memory device of claim 9, wherein the sub-interconnection comprises:
    a first sub-interconnection connecting the fifth vertical pillar of the first selection line to the first vertical pillar of the second selection line;
    a second sub-interconnection connecting the fifth vertical pillar coupled with the second selection line to the first vertical pillar coupled with the third selection line;
    a third sub-interconnection connecting the sixth vertical pillar coupled with the first selection line to the second vertical pillar coupled with the second selection line; and
    a fourth sub-interconnection connecting the sixth vertical pillar coupled with the second selection line to the second vertical pillar coupled with the third selection line.

11. The memory device of claim 10, further comprising:
    a fifth sub-interconnection connected to the third vertical pillar; and
    a sixth sub-interconnection connected to the fourth vertical pillar.

12. The memory device of claim 11, wherein the bit line comprises first to sixth bit lines sequentially arranged in the first direction, and
    wherein the first to sixth sub-interconnections are each connected to a respective one of the bit lines.

13. The memory device of claim 12, wherein the sub-interconnections are connected to the vertical pillars, respectively, via lower contacts provided on the vertical pillars, and
    the bit lines are connected to the sub-interconnections, respectively, via upper contacts provided on the sub-interconnections.

14. The memory device of claim 10, wherein the bit line comprises first to sixth bit lines sequentially arranged in the first direction,
    the first to fourth sub-interconnections are connected to the first, second, fifth, and sixth vertical pillars, respectively, via first lower contacts provided on the first, second, fifth and sixth vertical pillars,
    the first, fourth, sixth, and third bit lines are connected to the first to fourth sub-interconnections, respectively, via first upper contacts provided on the first to fourth sub-interconnections,
    the second bit line is connected to the third vertical pillar via a second lower contact and a second upper contact, which are sequentially stacked on the third vertical pillar coupled with each of the selection lines to be in contact with each other, and the fifth bit line is connected to the fourth vertical pillar via a third lower contact and a third upper contact, which are provided on the fourth vertical pillar coupled with each of the selection lines.

\* \* \* \* \*